(12) United States Patent
Kamimura et al.

(10) Patent No.: US 11,225,633 B2
(45) Date of Patent: Jan. 18, 2022

(54) TREATMENT LIQUID, METHOD FOR WASHING SUBSTRATE, AND METHOD FOR REMOVING RESIST

(71) Applicant: FUJIFILM Corporation, Tokyo (JP)

(72) Inventors: Tetsuya Kamimura, Haibara-gun (JP); Tomonori Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 397 days.

(21) Appl. No.: 16/180,107

(22) Filed: Nov. 5, 2018

(65) Prior Publication Data

US 2019/0071623 A1    Mar. 7, 2019

Related U.S. Application Data

(63) Continuation of application No. PCT/JP2017/017589, filed on May 9, 2017.

(51) Int. Cl.
*C11D 17/08*    (2006.01)
*C11D 7/08*    (2006.01)
(Continued)

(52) U.S. Cl.
CPC ............ *C11D 17/08* (2013.01); *C11D 3/0073* (2013.01); *C11D 7/02* (2013.01); *C11D 7/08* (2013.01); *C11D 7/10* (2013.01); *C11D 7/28* (2013.01); *C11D 7/50* (2013.01); *C11D 11/0047* (2013.01); *C23F 1/26* (2013.01); *C23F 1/28* (2013.01); *C23G 1/06* (2013.01); *C23G 1/086* (2013.01); *C23G 1/088* (2013.01); *C23G 1/10* (2013.01); *G03F 7/42* (2013.01); *G03F 7/423* (2013.01); *G03F 7/425* (2013.01); *G03F 7/426* (2013.01); *H01L 21/02063* (2013.01); *H01L 21/304* (2013.01); *H01L 21/308* (2013.01); *H01L 21/31133* (2013.01); *H01L 21/31144* (2013.01)

(58) Field of Classification Search
CPC ................................. C11D 17/08; C23G 1/06
See application file for complete search history.

(56) References Cited

U.S. PATENT DOCUMENTS 5,990,060 A * 11/1999 Ohmi .................. C03C 23/0075
134/1
10,377,978 B2    8/2019 Oie et al.
(Continued)

FOREIGN PATENT DOCUMENTS

JP    10-298589 A    11/1998
JP    2006-269677 A    10/2006
(Continued)

OTHER PUBLICATIONS

International Search Report of PCT/JP2017/017589 dated Aug. 1, 2017.
(Continued)

*Primary Examiner* — Liam J Heincer
*Assistant Examiner* — M. Reza Asdjodi
(74) *Attorney, Agent, or Firm* — Sughrue Mion, PLLC

(57) ABSTRACT

A treatment liquid is a treatment liquid for a semiconductor device, containing a fluorine-containing compound, a corrosion inhibitor, and calcium, in which the mass content ratio of the calcium to the fluorine-containing compound in the treatment liquid is $1.0\times10^{-10}$ to $1.0\times10^{-4}$.

45 Claims, 1 Drawing Sheet

(51) Int. Cl.
  *C23G 1/06*   (2006.01)
  *C11D 7/28*   (2006.01)
  *C11D 7/50*   (2006.01)
  *C23G 1/10*   (2006.01)
  *C11D 7/02*   (2006.01)
  *C11D 3/00*   (2006.01)
  *H01L 21/02*  (2006.01)
  *C23G 1/08*   (2006.01)
  *H01L 21/311* (2006.01)
  *C23F 1/28*   (2006.01)
  *G03F 7/42*   (2006.01)
  *C11D 11/00*  (2006.01)
  *C11D 7/10*   (2006.01)
  *H01L 21/304* (2006.01)
  *C23F 1/26*   (2006.01)
  *H01L 21/308* (2006.01)

(56) References Cited

U.S. PATENT DOCUMENTS

| | | | | |
|---|---|---|---|---|
| 2008/0283796 | A1* | 11/2008 | Yates | C09K 13/08 |
| | | | | 252/79.3 |
| 2009/0133716 | A1* | 5/2009 | Lee | H01L 21/02063 |
| | | | | 134/3 |
| 2010/0105595 | A1* | 4/2010 | Lee | C11D 7/3272 |
| | | | | 510/176 |
| 2016/0010035 | A1* | 1/2016 | Liu | C11D 7/3245 |
| | | | | 510/175 |
| 2017/0110363 | A1* | 4/2017 | Aoyama | C11D 3/364 |
| 2017/0240850 | A1* | 8/2017 | Oie | C11D 7/08 |
| 2017/0278701 | A1* | 9/2017 | Oie | C11D 7/12 |
| 2017/0335248 | A1* | 11/2017 | Oie | C11D 7/26 |
| 2019/0071623 | A1* | 3/2019 | Kamimura | G03F 7/425 |

FOREIGN PATENT DOCUMENTS

| | | |
|---|---|---|
| JP | 2009-019255 A | 1/2009 |
| JP | 2010-087326 A | 4/2010 |
| TW | 201619361 A | 6/2016 |
| TW | 201619362 A | 6/2016 |
| WO | 2016/076033 A1 | 5/2016 |
| WO | 2016/076034 A1 | 5/2016 |

OTHER PUBLICATIONS

Written Opinion of PCT/JP2017/017589 dated Aug. 1, 2017.
International Preliminary Report on Patentability with English Translation of the Written Opinion of PCT/JP2017/017589 dated Dec. 4, 2018.
Notification of Reason for Refusal dated Oct. 30, 2019 by the Korean Intellectual Property Office in counterpart application No. 10-2018-7033202.
Communication dated Apr. 21, 2020 by the Taiwanese Patent Application No. 106116418.
Communication dated Jan. 7, 2020, from the Japanese Patent Office in Application No. 2018-520750.

* cited by examiner

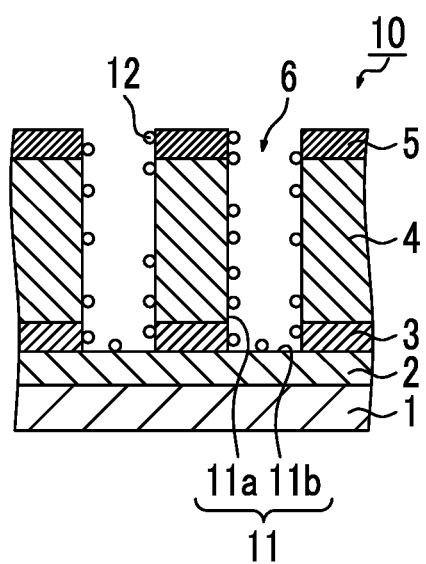

TREATMENT LIQUID, METHOD FOR WASHING SUBSTRATE, AND METHOD FOR REMOVING RESIST

CROSS-REFERENCE TO RELATED APPLICATIONS

This application is a Continuation of PCT International Application No. PCT/JP2017/017589, filed on May 9, 2017, which claims priority under 35 U.S.C. § 119(a) to Japanese Patent Application No. 2016-111077, filed on Jun. 2, 2016, and Japanese Patent Application No. 2017-016654, filed on Feb. 1, 2017. Each of the above application(s) is hereby expressly incorporated by reference, in its entirety, into the present application.

BACKGROUND OF THE INVENTION

1. Field of the Invention

The present invention relates to a treatment liquid, a method for washing a substrate, and a method for removing a resist.

2. Description of the Related Art

A semiconductor device such as a charge-coupled device (CCD) and a memory is manufactured by forming a laminate having fine electronic circuit patterns using a photolithographic technique. Specifically, the semiconductor device is manufactured by forming a resist film on a laminate having a metal layer that serves as a wiring material or the like, an etching stop film, and an interlayer insulating film on a substrate, followed by carrying out a photolithography step and a dry etching step (for example, a plasma etching treatment).

Specifically, in the photolithography step, the metal layer and/or the interlayer insulating film on the substrate is etched by a dry etching treatment using the obtained resist film as a mask.

At this time, residues derived from the metal layer and/or the interlayer insulating film, or the like adhere to the substrate, the metal layer, and/or the interlayer insulating film in some cases. In order to remove the adhering residues, washing using a treatment liquid is typically performed in many cases.

Furthermore, the resist film used as a mask during the etching is then removed from the laminate using a dry method (dry ashing) by ashing, a wet method, or the like. In some cases, the residues derived from the resist film or the like adhere to the laminate from which the resist has been removed using the dry ashing method. In order to remove the adhering residues, washing using a treatment liquid is typically performed in many cases.

On the other hand, examples of the wet method for removing the resist film include an aspect in which the resist film is removed using a treatment liquid.

As described above, the treatment liquid is used for the removal of residues (etching residues and ashing residues) and/or a resist film, or the like in a semiconductor device manufacturing step.

By way of an example of such a treatment liquid, a titanium nitride peeling liquid which contains hydrofluoric acid, hydrogen peroxide, and water, and further contains an inorganic acid other than the hydrofluoric acid is described in JP2009-019255A.

SUMMARY OF THE INVENTION

The present inventors have tried to perform washing of a substrate (laminate) comprising a metal layer and/or an interlayer insulating film, using the aqueous composition described in JP2009-019255A, and as a result, they have found that the aqueous composition is excellent in residue removing performance (residue removing capability), but corrodes a metal layer containing cobalt (Co).

In addition, treatment liquids in recent years are required to have performance (defect performance) of hardly causing failures (defects) in which particulate foreign matters adhere to a substrate, a metal layer, and/or an interlayer insulating film after washing, in addition to more excellent residue removing capability, but it has also been found that the aqueous composition described in JP2009-019255A is particularly deteriorated in defect performance.

Therefore, an object of the present invention is to provide a treatment liquid which has excellent residue removing capability and excellent corrosion resistance for a metal layer containing Co (hereinafter simply referred to as "excellent corrosion resistance for Co" in some cases), and is capable of suppressing generation of defects.

In addition, another object of the present invention is to provide a method for washing a substrate and a method for removing a resist.

The present inventors have conducted extensive studies on the objects, and as a result, they have found that the objects can be accomplished by using a treatment liquid for a semiconductor device, containing a fluorine-containing compound, a corrosion inhibitor, and calcium, in which the content of the calcium to the content of the fluorine-containing compound in the treatment liquid is within a predetermined range, thereby completing the present invention.

That is, the present inventors have found that the objects can be accomplished by the following configurations.

[1] A treatment liquid for a semiconductor device, comprising:
a fluorine-containing compound;
a corrosion inhibitor; and
calcium,
in which the mass content ratio of the calcium to the fluorine-containing compound in the treatment liquid is $1.0\times10^{-10}$ to $1.0\times10^{-4}$.

[2] The treatment liquid as described in [1],
in which the mass content ratio of the calcium to the corrosion inhibitor is $1.0\times10^{-10}$ to $1.0\times10^{-4}$.

[3] The treatment liquid as described in [1] or [2],
in which the content of the calcium is 0.1 ppt by mass to 1,000 ppb by mass with respect to the total mass of the treatment liquid.

[4] The treatment liquid as described in any one of [1] to [3], further comprising an organic solvent.

[5] The treatment liquid as described in [4], further comprising water,
in which the content of the water is 20% to 98% by mass with respect to the total mass of the treatment liquid, and the content of the organic solvent is 1% to 40% by mass with respect to the total mass of the treatment liquid.

[6] The treatment liquid as described in [4], further comprising water,
in which the content of the water is 1% to 40% by mass with respect to the total mass of the treatment liquid, and the content of the organic solvent is 20% to 98% by mass with respect to the total mass of the treatment liquid.

[7] The treatment liquid as described in any one of [1] to [6], further comprising an inorganic acid.

[8] The treatment liquid as described in [7], in which the mass content ratio of the inorganic acid to the corrosion inhibitor is 0.01 to 10.

[9] The treatment liquid as described in any one of [1] to [8], further comprising lead.

[10] The treatment liquid as described in [7] or [8], further comprising lead, in which the mass content ratio of the lead to the inorganic acid is $1.0 \times 10^{-10}$ to $1.0 \times 10^{-4}$.

[11] The treatment liquid as described in [9] or [10], in which the mass content ratio of the lead to the corrosion inhibitor is $6.0 \times 10^{-11}$ to $1.0 \times 10^{-4}$.

[12] The treatment liquid as described in any one of [9] to [11], in which the content of the lead is 0.1 ppt by mass to 10 ppb by mass with respect to the total mass of the treatment liquid.

[13] The treatment liquid as described in any one of [1] to [12], further comprising an oxidizing agent.

[14] The treatment liquid as described in any one of [7], [8], and [10], further comprising an oxidizing agent, in which the mass content ratio of the inorganic acid to the oxidizing agent is 0.01 to 10.

[15] The treatment liquid as described in [13] or [14], in which the oxidizing agent is hydrogen peroxide.

[16] The treatment liquid as described in any one of [1] to [15], in which pH is more than 1.5 and less than 7.0.

[17] The treatment liquid as described in any one of [1] to [16], in which the fluorine-containing compound is at least one selected from the group consisting of hydrofluoric acid, ammonium fluoride, tetramethylammonium fluoride, tetrafluoroboric acid, hexafluorophosphoric acid, hexafluorosilicic acid, ammonium tetrafluoroborate, ammonium hexafluorophosphate, and ammonium hexafluorosilicate.

[18] The treatment liquid as described in any one of [1] to [17], in which in a case where the viscosity of the treatment liquid at 23° C. is measured using a rotational viscometer, the ratio of the viscosity of the treatment liquid at a rotation speed of 100 rpm to the viscosity of the treatment liquid at a rotation speed of 1,000 rpm is 1.0 to 20.

[19] The treatment liquid as described in any one of [1] to [18], in which the semiconductor device contains a substrate comprising a metal layer containing Co, and the treatment liquid is used for a treatment to the metal layer.

[20] The treatment liquid as described in any one of [1] to [19], in which the semiconductor device contains a substrate comprising a metal layer containing W, and the treatment liquid is used for a treatment to the metal layer.

[21] The treatment liquid as described in any one of [1] to [20], in which the semiconductor device contains a substrate comprising a layer containing at least one selected from the group consisting of $SiO_x$, SiN, and SiOC, where x represents a number of 1 to 3, and the treatment liquid is used for a treatment to the layer.

[22] The treatment liquid as described in any one of [1] to [21], in which a resist film is formed during the production of the semiconductor device, and the treatment liquid is used for the removal of a resist which is at least one selected from the group consisting of the resist film and a residue of the resist film.

[23] A method for washing a substrate, comprising a washing step B in which a substrate comprising a metal layer containing Co is washed using the treatment liquid as described in any one of [1] to [22].

[24] A method for washing a substrate, comprising a washing step B in which a substrate comprising a metal layer containing W is washed using the treatment liquid as described in any one of [1] to [22].

[25] A method for washing a substrate, comprising a washing step B in which a substrate comprising a layer containing at least one selected from the group consisting of $SiO_x$, SiN, and SiOC, where x represents a number of 1 to 3, is washed using the treatment liquid as described in any one of [1] to [22].

[26] The method for washing a substrate as described in any one of [23] to [25], further comprising:
a drainage recovering step C in which drainage of the treatment liquid used in the washing step B is recovered;
a washing step D in which a newly prepared substrate comprising at least one selected from the group consisting of a metal layer containing Co, a metal layer containing W, and a layer containing at least one selected from the group consisting of $SiO_x$, SiN, and SiOC, where x represents a number of more than 0 and less than 3, is washed using the recovered drainage of the treatment liquid;
a drainage recovering step E in which drainage of the treatment liquid used in the washing step D is recovered; and
repeating the washing step D and the drainage recovering step E.

[27] The method for washing a substrate as described in any one of [23] to [26], further comprising:
a treatment liquid preparing step A in which a treatment liquid is prepared before the washing step B; and
an ion removing step F in which calcium ions are removed from at least one selected from the group consisting of the fluorine-containing compound and the corrosion inhibitor before the treatment liquid preparing step A, and/or
an ion removing step G in which calcium ions in the treatment liquid are removed before the washing step B and after the treatment liquid preparing step A.

[28] The method for washing a substrate as described in [27], in which water is used during the preparation of the treatment liquid in the treatment liquid preparing step A, and the ion removing step F is a step in which calcium ions are removed from at least one selected from the group consisting of the fluorine-containing compound, the corrosion inhibitor, and water.

[29] The method for washing a substrate as described in any one of [23] to [28], in which the method includes a treatment liquid preparing step A in which a treatment liquid is prepared before the washing step B, water is used during the preparation of the treatment liquid in the treatment liquid preparing step A, and the method further comprises at least one step selected from the group consisting of a charge eliminating step I in which water is subjected to charge elimination before the treatment liquid preparing step A, and a charge eliminating step J in which the treatment liquid is subjected to charge elimination before the washing step B and after the treatment liquid preparing step A.

[30] A method for removing a resist, comprising removing a resist which is at least one selected from the group consisting of a resist film and a residue of the resist film, using the treatment liquid as described in any one of [1] to [22].

According to the present invention, it is possible to provide a treatment liquid which has excellent residue removing capability and excellent corrosion resistance for a metal layer containing Co, and is capable of suppressing generation of defects (hereinafter also expressed as "having the effects of the present invention").

In addition, according to the present invention, it is possible to provide a method for washing a substrate and a method for removing a resist.

BRIEF DESCRIPTION OF THE DRAWING

FIG. 1 is a schematic cross-sectional view showing an example of a laminate (a substrate comprising a metal layer and an interlayer insulating film) which can be applied to a method for washing a substrate according to an embodiment of the present invention.

DESCRIPTION OF THE PREFERRED EMBODIMENTS

Hereinbelow, the present invention will be described, based on embodiments.

Furthermore, in the present invention, the numerical value ranges shown using "to" mean ranges including the numerical values indicated before and after "to" as the lower limit value and the upper limit value, respectively.

Moreover, in the present invention, a reference to "preparation" is meant to encompass delivering a predetermined material by purchases or the like, in addition to comprising specific materials by synthesis, combination, or the like.

Incidentally, in the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In addition, in citations for a group (atomic group) in the present invention, in a case where the group (atomic group) is denoted without specifying whether it is substituted or unsubstituted, the group (atomic group) includes both a group (atomic group) having no substituent and a group (atomic group) having a substituent within a range not impairing the effects of the present invention. For example, a "hydrocarbon group" includes not only a hydrocarbon group having no substituent (unsubstituted hydrocarbon group) but also a hydrocarbon group having a substituent (substituted hydrocarbon group). This also applies to the respective compounds.

In addition, "radiation" in the present invention means, for example, a bright line spectrum of a mercury lamp, far ultraviolet rays typified by excimer laser, extreme ultraviolet rays (EUV light), X-rays, or electron beams. Further, the term "light" in the present invention means actinic rays or radiation. Unless otherwise indicated, the term "exposure" in the present invention includes not only exposure to a bright line spectrum of a mercury lamp, far ultraviolet rays typified by excimer laser, X-rays, EUV light, or the like but also exposure using lithography with particle beams such as electron beams and ion beams.

In addition, in the present invention, "(meth)acrylate" represents both or either of acrylate and methacrylate.

[Treatment Liquid]

The treatment liquid according to an embodiment of the present invention is a treatment liquid for a semiconductor device, containing a fluorine-containing compound, a corrosion inhibitor, and calcium, in which the mass content ratio of the calcium to the fluorine-containing compound in the treatment liquid is $1.0 \times 10^{-10}$ to $1.0 \times 10^{-4}$.

As one of the features of the treatment liquid according to the embodiment, the content of calcium/the content of the fluorine-containing compound in the treatment liquid may be controlled to be within a predetermined range.

The present inventors have considered that a cause of generation of particulate foreign matters (defects) on a subject to be washed after washing is derived from the components included in the treatment liquid, and they have thus conducted extensive studies on the components or the like of the foreign matters. As a result, a possibility that the foreign matters can be sparingly soluble or insoluble salt compounds has been suggested. In general, in the treatment liquid containing a fluorine-containing compound, fluoride ions are generated in the treatment liquid. The present inventors have presumed that the fluoride ions are bonded to other components included in the treatment liquid to form a sparingly soluble or insoluble salt compound, which causes generation of defects.

Above all, the present inventors have considered that the calcium ions are likely to form sparingly soluble calcium salt compounds between the fluoride ions, and suppression of generation of the sparingly soluble calcium salt compounds is linked to prevention of defects.

However, during the investigation, it has been discovered that in a case where the content of the calcium in the treatment liquid is reduced, the residue removing capability may be deteriorated in some cases.

Based on this discovery, the present invention has been completed. That is, it was possible to obtain a treatment liquid having the effects of the present invention by incorporating predetermined components and controlling the content of calcium/the content of the fluorine-containing compound in the treatment liquid to $1.0 \times 10^{-10}$ to $1.0 \times 10^{-4}$.

In a case where the content of calcium/the content of the fluorine-containing compound in the treatment liquid is more than $1.0 \times 10^{-4}$, the fluoride ions and the calcium ions contained in the treatment liquid are likely to produce more sparingly soluble calcium salt compounds, and the calcium salt compounds are likely to adhere to members constituting a semiconductor device and generate defects.

On the other hand, in a case where the content of calcium/the content of the fluorine-containing compound in the treatment liquid is less than $1.0 \times 10^{-10}$, the calcium ions that do not form salt compounds in the treatment liquid are present, and thus, the residue removing capability is hardly improved. Further, the calcium ions adhere to members constituting a semiconductor device, and thus, the defect performance is also hardly improved.

(pH)

The pH of the treatment liquid is not particularly limited, and is preferably 1.0 or more, and more preferably more than 1.5, and also preferably 14.0 or less, and more preferably less than 7.0.

Above all, in a case where the treatment liquid is a solvent-based treatment liquid, the pH is preferably 5 or more in view that the treatment liquid has more excellent corrosion resistance.

On the other hand, in a case where the treatment liquid is a water-based treatment liquid, the pH is more preferably 5.0 or less.

In a case where the pH is within the range, the treatment liquid has more excellent effects of the present invention.

The pH of the treatment liquid can be measured by the method described in Examples.

(Viscosity Characteristics)

The viscosity characteristics of the treatment liquid are not particularly limited, but in a case where the viscosity of the treatment liquid according to the embodiment of the present invention at 23° C. is measured using a rotational viscometer, the ratio (viscosity $\eta_1$/viscosity $\eta_2$, hereinafter also referred to as "$\eta_1/\eta_2$") of the viscosity (viscosity $\eta_1$) of the treatment liquid at a rotation speed of 100 rpm to the viscosity (viscosity $\eta_2$) of the treatment liquid at a rotation speed of 1,000 rpm is preferably 1.0 or more, more preferably 1.2 or more, and still more preferably 1.7 or more, and also preferably 20 or less, and more preferably 10 or less.

In a case where $\eta_1/\eta_2$ is 1.0 or more, the treatment liquid has more excellent corrosion resistance, in a case where $\eta_1/\eta_2$ is 1.2 or more, the treatment liquid has more excellent corrosion resistance, and in a case where $\eta_1/\eta_2$ is 1.7 or more, the treatment liquid has particularly excellent corrosion resistance.

Furthermore, in the present specification, the corrosion resistance is intended to mean anticorrosive performance for a metal layer and/or an interlayer insulating film in a laminate to be treated using a treatment liquid.

Moreover, in a case where $\eta_1/\eta_2$ is 20 or less, the treatment liquid has more excellent effects of the present invention.

In addition, in the present specification, the viscosity is intended to mean a viscosity measured under the measurement conditions described in Examples, using a device equivalent to a rotational viscometer (trade name Brookfield viscometer DV3T, manufactured by EKO Seiki Co., Ltd.).

(Coarse Particles)

It is preferable that the treatment liquid substantially does not include coarse particles.

The coarse particles refer to particles having a diameter of 0.2 μm or more, for example, in a case of considering the shapes of the particles as spheres. Further, an expression, substantially not including coarse particles, indicates that the number of particles in a size of 0.2 μm or more in 1 mL of the treatment liquid in a case where measurement of the treatment liquid using a commercially available measuring device in a light scattering type in-liquid particle measurement system is carried out is 10 or less.

Moreover, the coarse particles included in the treatment liquid are particles of dusts, organic solids, inorganic solids, or the like which are included as impurities in raw materials, or particles of dusts, organic solids, inorganic solids, or the like which are incorporated as a contaminant during the preparation of a treatment liquid, and correspond to the particles which are not ultimately dissolved in the treatment liquid and present as particles.

The amount of the coarse particles present in the treatment liquid can be measured in the liquid phase, using a laser as a light source.

Examples of a method for removing the coarse particles include a treatment such as filtering which will be described later.

Hereinafter, the respective components contained in the treatment liquid will be described.

[Fluorine-Containing Compound (A)]

The fluorine-containing compound contained in the treatment liquid is not particularly limited as long as a fluorine atom is contained in the compound, and a known fluorine-containing compound can be used.

Furthermore, in the relationship of the fluorine-containing compound with an inorganic acid which will be described later, the inorganic acid including a fluorine atom corresponds to a fluorine-containing compound.

Above all, as the fluorine-containing compound, those that are dissociated in the treatment liquid to discharge fluoride ions are preferable.

Examples of the fluorine-containing compound include hydrofluoric acid (hydrofluoric acid, HF), ammonium fluoride ($NH_4F$), tetramethylammonium fluoride (TMAF), tetrafluoroboric acid ($HBF_4$), hexafluorophosphoric acid ($HPF_6$), hexafluorosilicic acid ($H_2SiF_6$), ammonium tetrafluoroborate, ammonium hexafluorophosphate, and ammonium hexafluorosilicate, and among these, ammonium fluoride ($NH_4F$) is preferable in view that it has more excellent effects of the present invention, particularly, more excellent corrosion resistance for Co.

In addition, as a counter ion, a cation other than ammonium, for example, tetramethylammonium may be used.

The content of the fluorine-containing compound is not particularly limited, but is preferably 0.001% by mass or more, more preferably 0.01% by mass or more, still more preferably 0.02% by mass or more, and particularly preferably 0.03% by mass or more, with respect to the total mass of the treatment liquid. The upper limit thereof is preferably 10% by mass or less, more preferably 5% by mass or less, and still more preferably 3% by mass or less.

In a case where the content of the fluorine-containing compound is 0.001% by mass or more, the treatment liquid has more excellent residue removing capability.

On the other hand, in a case where the content of the fluorine-containing compound is 10% by mass or less, the treatment liquid has more excellent corrosion resistance.

In a case where the fluorine-containing compound does not contain ammonium fluoride, the content of the fluorine-containing compound is more preferably 0.001% to 1% by mass, and particularly preferably 0.5% by mass or less, in view that the treatment liquid has more excellent corrosion resistance for Co.

In a case where the fluorine-containing compound contains ammonium fluoride, and in particular, the fluorine-containing compound includes ammonium fluoride, the content of the fluorine-containing compound is more preferably 0.001% to 5% by mass, and particularly preferably 0.001% by mass or more and less than 5% by mass, in view that the treatment liquid has more excellent corrosion resistance for Co.

In addition, the fluorine-containing compound may be used singly or in combination of two or more kinds thereof. In a case where two or more kinds of fluorine-containing compounds are used in combination, the total content thereof is preferably within the range.

[Calcium (B)]

Calcium may be in any form of an ion, a complex compound, a salt compound, an alloy, or the like. Further, calcium may be in the form of particles.

Calcium may be inevitably contained in the respective components (raw materials) included in the treatment liquid, may be inevitably incorporated into the treatment liquid in the production of the treatment liquid, and may be intentionally added to the treatment liquid and/or the raw materials.

The content of the calcium in the treatment liquid is not particularly limited, but is preferably 0.1 ppt by mass or more, and more preferably 0.3 ppt by mass or more, and also preferably 1,000 ppb by mass or less, more preferably 100 ppb by mass or less, still more preferably 90 ppb by mass or less, particularly preferably 1.0 ppb by mass or less, and most preferably 0.9 ppb by mass or less, with respect to the total mass of the treatment liquid.

In a case where the content of the calcium is 1,000 ppb by mass or less, generation of defects can be further suppressed.

Furthermore, in a case where the content of the calcium is 90 ppb by mass or less, the treatment liquid has more excellent residue removing capability.

Moreover, in a case where the content of the calcium is 1.0 ppb by mass or less, the treatment liquid has more excellent residue removing capability and generation of defects can be further suppressed.

In addition, in a case where the content of the calcium is 0.9 ppb by mass or less, the treatment liquid has more excellent residue removing capability and generation of defects can be further suppressed.

On the other hand, in a case where the content of the calcium is 0.1 ppt by mass or more, the treatment liquid has more excellent residue removing capability.

Furthermore, in the present specification, the content of the calcium in the treatment liquid is measured by an inductively coupled plasma mass spectrometry (ICP-MS) method. Measurement of the content of each of the specific metal elements such as a Ca atom, a Fe atom, and a Na atom by the ICP-MS method can be performed, for example, by the measurement method described in Examples, using a device equivalent to NexION350S (trade name, manufactured by PerkinElmer).

Here, in the ICP-MS method, the content of the calcium in the treatment liquid, that is, a total content of the calcium ions and calcium in the non-ionic state is quantified. Accordingly, in the present specification, a simple reference to "the content of the calcium in the treatment liquid" is intended to mean a total content of the calcium in the treatment liquid, irrespective of the forms of calcium.

<Content of Calcium (B)/Content of Fluorine-Containing Compound (A)>

The mass content ratio (the content of the calcium (B)/the content of the fluorine-containing compound (A), hereinafter also referred to as "B/A") of calcium to the fluorine-containing compound in the treatment liquid according to the embodiment is $1.0 \times 10^{-10}$ to $1.0 \times 10^{-4}$, preferably $5.0 \times 10^{-10}$ or more, more preferably $1.0 \times 10^{-9}$ or more, and still more preferably $1.5 \times 10^{-9}$ or more, and also preferably $1.0 \times 10^{-5}$ or less, more preferably less than $1.0 \times 10^{-5}$, still more preferably $9.0 \times 10^{-6}$ or less, particularly preferably $1.0 \times 10^{-7}$ or less, and most preferably $1.0 \times 10^{-8}$ or less.

In a case where B/A is $1.0 \times 10^{-9}$ or more, the treatment liquid has more excellent corrosion resistance.

On the other hand, in a case where B/A is less than $1.0 \times 10^{-5}$, the treatment liquid has more excellent residue removing capability.

Furthermore, in a case where B/A is $1.0 \times 10^{-7}$ or less, generation of defects is further suppressed.

In addition, in a case where B/A is $1.0 \times 10^{-8}$ or less, the treatment liquid has more excellent corrosion resistance and generation of defects is further suppressed.

[Corrosion Inhibitor (C)]

The corrosion inhibitor is not particularly limited and a known corrosion inhibitor can be used. Further, the corrosion inhibitor may be referred to as an anticorrosion agent in some cases.

Examples of the corrosion inhibitor include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, tolyltriazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazol-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyltetrazole, bismuthiol I, 1,3-dimethyl-2-imidazolidinone, 1,5-pentamethylenetetrazole, 1-phenyl-5-mercaptotetrazole, diaminomethyltriazine, imidazolinethione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, amines, pyrazoles, propanethiol, silanes, secondary amines, benzohydroxamic acids, heterocyclic nitrogen inhibitors, ascorbic acid, thiourea, 1,1,3,3-tetramethylurea, urea, urea derivatives, uric acid, potassium ethylxanthate, glycine, dodecyl phosphonic acid, iminodiacetic acid, boric acid, malonic acid, succinic acid, nitrilotriacetic acid, sulfolane, 2,3,5-trimethylpyrazine, 2-ethyl-3,5-dimethyl pyrazine, quinoxaline, acetylpyrrole, pyridazine, histadine, pyrazine, (reduced) glutathione, cysteine, cystine, thiophene, mercaptopyridine N-oxide, thiamine HCl, tetraethyl thiuram disulfide, 2,5-dimercapto-1,3-thiadiazole-ascorbic acid, ascorbic acid, catechol, t-butyl catechol, phenol, and pyrogallol.

As the corrosion inhibitor, aliphatic carboxylic acids such as dodecanoic acid, palmitic acid, 2-ethylhexanoic acid, and cyclohexanoic acid; carboxylic acids having a chelating ability, such as citric acid, malic acid, oxalic acid, malonic acid, succinic acid, itaconic acid, maleic acid, glycolic acid, mercaptoacetic acid, mercaptosuccinic acid, mercaptopropionic acid, salicylic acid, sulfosalicylic acid, anthranilic acid, N-methyl anthranilate, 3-amino-2-naphthoic acid, 1-amino-2-naphthoic acid, 2-amino-1-naphthoic acid, 1-aminoanthraquinone-2-carboxylic acid, tannic acid, and gallic acid; or the like can also be used.

Furthermore, as the corrosion inhibitor, anionic surfactants such as a salt of coconut fatty acid, a salt of sulfonated castor oil, a lauryl sulfate salt, a polyoxyalkylene allyl phenyl ether sulfate salt, alkylbenzene sulfonic acid, an alkylbenzene sulfonate, alkyldiphenyl ether disulfonate, alkylnaphthalene sulfonate, a dialkyl sulfosuccinate salt, isopropyl phosphate, a polyoxyethylene alkyl ether phosphate salt, and a polyoxyethylene allyl phenyl ether phosphate salt (NEWKALGEN FS-3PG and the like); cationic surfactants such as oleylamine acetate, lauryl pyridinium chloride, cetylpyridinium chloride, lauryl trimethylammonium chloride, stearyltrimethylammonium chloride, behenyltrimethylammonium chloride, and didecyldimethylammonium chloride; amphoteric surfactants such as coconut alkyldimethylamine oxide, fatty acid amidopropyldimethylamine oxide, alkylpolyaminoethylglycine hydrochloride, an amidobetaine type active agent, an alanine type active agent, and lauryl iminodipropionic acid; non-ionic surfactants of a polyoxyalkylene primary alkyl ether or a polyoxyalkylene secondary alkyl ether such as polyoxyethylene octyl ether, polyoxyethylene decyl ether, polyoxyethylene lauryl ether (PHOSTEN HLP-1 and the like), polyoxyethylene laurylamine, polyoxyethylene oleylamine, polyoxyethylene polystyrylphenyl ether, polyoxyalkylene polystyrylphenyl ether, or the like, and other polyoxyalkylene-based non-ionic surfactants such as polyoxyethylene dilaurate, polyoxyethylene laurate, polyoxyethylenated castor oil, polyoxyethylenated hydrogenated castor oil, sorbitan lauric ester, polyoxyethylene sorbitan lauric ester, fatty acid diethanolamide; and fatty acid alkyl esters such as octyl stearate and trimethylolpropane tridecanoate; or polyether polyols such as polyoxyalkylene butyl ether, polyoxyalkylene oleyl ether, and trimethylol propane tris(polyoxyalkylene) ether can also be used.

Examples of a commercially available product thereof include NEWKALGEN FS-3PG (manufactured by Takemoto Yushi Co., Ltd.) and PHOSTEN HLP-1 (manufactured by Nikko Chemicals Co., Ltd.).

Moreover, as the corrosion inhibitor, a hydrophilic polymer can also be used.

Examples of the hydrophilic polymer include polyglycols such as polyethylene glycol, alkyl ethers of polyglycols, polysaccharides such as polyvinyl alcohol, polyvinyl pyrrolidone, and alginic acid, carboxylic acid-containing polymers such as polymethacrylic acid and polyacrylic acid, polyacrylamide, polymethacrylamide, and polyethylene imine. Specific examples of such a hydrophilic polymer include the water-soluble polymers described in paragraphs 0042 to 0044 of JP2009-088243A and paragraph 0026 of JP2007-194261A.

Furthermore, as the corrosion inhibitor, a cerium salt can also be used.

The cerium salt is not particularly limited and a known cerium salt can be used.

Examples of the cerium salt include trivalent cerium salts such as cerium acetate, cerium nitrate, cerium chloride, cerium carbonate, cerium oxalate, and cerium sulfate. Further, examples of the tetravalent cerium salt include cerium sulfate, ammonium cerium sulfate, ammonium cerium nitrate, diammonium cerium nitrate, and cerium hydroxide.

The corrosion inhibitor may include a substituted or unsubstituted benzotriazole. A suitable substituted benzotriazole is not limited thereto, but examples thereof include an alkyl group, an aryl group, a halogen group, an amino group, a nitro group, an alkoxy group, or a benzotriazole substituted with a hydroxyl group. Other examples of the substituted benzotriazole include a fusion with one or more aryl (for example, phenyl) or heteroaryl groups.

Examples of the benzotriazole which is suitable for use as the corrosion inhibitor include, but are not limited to, benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole (5-MBTA), benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl)benzotriazole.

In addition, as the benzotriazole, 2,2'-{[(4-methyl-1H-benzotriazol-1-yl)methyl]imino}bisethanol, 2,2'-{[(5-methyl-1H-benzotriazol-1-yl)methyl]imino}bisethanol, 2,2'-{[[(4-methyl-1H-benzotriazol-1-yl)methyl]imino}bisethane, or 2,2'-{[(4-methyl-1H-benzotriazol-1-yl)methyl]imino}bispropane, and N,N-bis(2-ethylhexyl)-(4 or 5)-methyl-1H-benzotriazole-1-methylamine, or the like can be used.

Furthermore, as the corrosion inhibitor, a sugar alcohol can also be used. The sugar alcohol is not particularly limited, but examples thereof include sorbitol, xylitol, sucrose, mannitol, maltitol, and lactitol, and among these, sorbitol is preferable.

Incidentally, as the corrosion inhibitor, a polyaminocarboxylic acid or a salt thereof can also be used. The polyaminocarboxylic acid or a salt thereof is not particularly limited, but examples thereof include ethylenediaminetetraacetic acid (EDTA), trans-1,2-cyclohexanediaminetetraacetic acid (CyDTA), nitrilotriacetic acid (NTA), diethylenetriaminepentaacetic acid (DTPA), N-(2-hydroxyethyl)ethylenediamine-N,N',N'-triacetic acid (EDTA-OH), ammonium salts and amine salts thereof, among which ethylenediaminetetraacetic acid (EDTA) or diethylenetriaminepentaacetic acid (DTPA) is preferable.

In addition, as the corrosion inhibitor, a compound which is hereinafter also represented by Formula (D) or (E) can also be used.

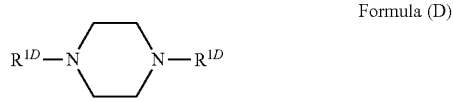

Formula (D)

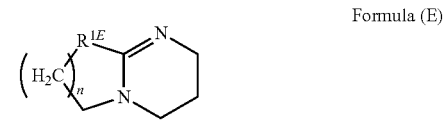

Formula (E)

In Formula (D), $R^{1D}$ represents a hydrogen atom or an alkyl group, and in case of two $R^{1D}$'s are present, they may be the same as or different from each other, and may be bonded to each other to form a ring.

The number of carbon atoms of the alkyl group of $R^{1D}$ is not particularly limited, but is preferably 1 to 6, and more preferably 1 or 2. Examples of the compound represented by Formula (D) include N,N'-dimethylpiperazine and 1,4-diazabicyclo[2.2.2]octane (DABCO), and DABCO is preferable.

In Formula (E), $R^{1E}$ represents —$CH_2$— or —NR— (R: a hydrogen atom or an alkyl group), n represents an integer of 1 to 3. Examples of the compound represented by Formula (E) include 1,8-diazabicyclo[5.4.0]undec-7-ene (DBU), 1,5,7-triazabicyclo[4.4.0]dec-5-ene (TBD), and 7-methyl-1,5,7-triazabicyclo[4.4.0]dec-5-ene (MTBD), and among these, DBU is preferable.

From the viewpoint of further improving the corrosion resistance, it is preferable that the corrosion inhibitor includes at least one compound selected from the group consisting of a compound represented by Formula (A), a compound represented by Formula (B), a compound represented by Formula (C), the compound represented by Formula (D), the compound represented by Formula (E), a sugar alcohol, a polyaminocarboxylic acid or a salt thereof, and a tetrazole (which may have a substituent or may be unsubstituted), and among these, in view of obtaining a treatment liquid having more excellent effects of the present invention, it is more preferable that the corrosion inhibitor includes at least one compound selected from the group consisting of the compound represented by Formula (A), the compound represented by Formula (C), a sugar alcohol, a polyaminocarboxylic acid or a salt thereof, the compound represented by Formula (D), and the compound represented by Formula (E).

In addition, in view that the treatment liquid has more excellent residue removing capability, it is still more preferable that the corrosion inhibitor contains at least one selected from the group consisting of the compound represented by Formula (A), the compound represented by Formula (C), and the sugar alcohol, each of which includes a hydroxyl group in the structure. This tendency is more noticeable in a case where the fluorine-containing compound is ammonium fluoride.

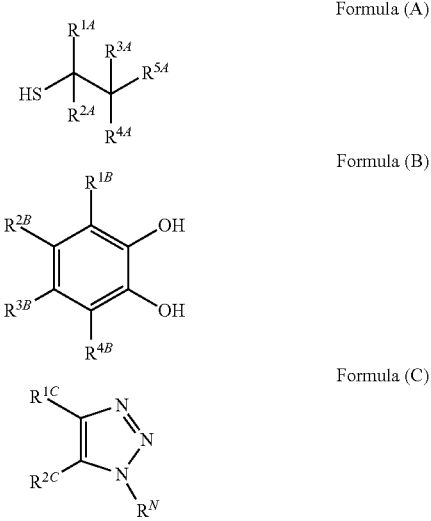

Formula (A)

Formula (B)

Formula (C)

In Formula (A), $R^{1A}$ to $R^{5A}$ each independently represent a hydrogen atom, a substituted or unsubstituted hydrocarbon group, a hydroxyl group, a carboxyl group, or a substituted or unsubstituted amino group. However, at least one group selected from a hydroxyl group, a carboxyl group, or a substituted or unsubstituted amino group is included in the structure; a hydroxyl group is more preferably included in the structure; and two or more hydroxyl groups are still more preferably included in the structure.

In Formula (B), $R^{1B}$ to $R^{4B}$ each independently represent a hydrogen atom, or a substituted or unsubstituted hydrocarbon group.

In Formula (C), $R^{1C}$, $R^{2C}$, and $R^N$ each independently represent a hydrogen atom, or a substituted or unsubstituted hydrocarbon group. Incidentally, $R^{1C}$ and $R^{2C}$ may be bonded to each other to form a ring.

In Formula (A), as the hydrocarbons represented by $R^{1A}$ to $R^{5A}$, an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

Furthermore, examples of the substituent in a case where the hydrocarbon group is substituted include a hydroxyl group, a carboxyl group, and a substituted or unsubstituted amino group (the substituent in a case where the amino group is substituted is preferably an alkyl group having 1 to 6 carbon atoms, and more preferably an alkyl group having 1 to 3 carbon atoms).

In addition, in Formula (A), at least one group selected from a hydroxyl group, a carboxyl group, or a substituted or unsubstituted amino group (the substituent in a case where the amino group is substituted is preferably an alkyl group having 1 to 6 carbon atoms, and more preferably an alkyl group having 1 to 3 carbon atoms) is included in the structure.

In Formula (A), examples of the substituted or unsubstituted hydrocarbon group represented by $R^{1A}$ to $R^{5A}$ include a hydrocarbon group having 1 to 6 carbon atoms, which is substituted with a hydroxyl group, a carboxyl group, or an amino group.

Examples of the compound represented by Formula (A) include 1-thioglycerol, L-cysteine, mercaptopropionic acid, and thiomalic acid (mercaptosuccinic acid).

In Formula (B), the substituted or unsubstituted hydrocarbon groups represented by $R^{1B}$ to $R^{4B}$ each have the same definitions as the substituted or unsubstituted hydrocarbon groups represented by $R^{1A}$ to $R^{5A}$ in Formula (A).

Preferred examples of the substituted or unsubstituted hydrocarbon groups represented by $R^{1B}$ to $R^{4B}$ include a hydrocarbon group having 1 to 6 carbon atoms, such as a methyl group, an ethyl group, a propyl group, and a t-butyl group.

Examples of the compound represented by Formula (B) include catechol and t-butyl catechol.

In Formula (C), examples of the substituted or unsubstituted hydrocarbon groups represented by $R^{1C}$, $R^{2C}$, and $R^N$ each have the same definitions as the substituted or unsubstituted hydrocarbon groups represented by $R^{1A}$ to $R^{5A}$ in Formula (A).

As the substituted or unsubstituted hydrocarbon groups represented by $R^{1C}$, $R^{2C}$, and $R^N$, a hydrocarbon group having 1 to 6 carbon atoms, such as a methyl group, an ethyl group, a propyl group, and a butyl group, is preferable.

Furthermore, it is preferable that $R^{1C}$ and $R^{2C}$ are bonded to each other to form a ring, and as a ring formed by the bonding of $R^{1C}$ and $R^{2C}$, a benzene ring is preferable. In a case where $R^{1C}$ and $R^{2C}$ are bonded to each other to form a ring, they may further have a substituent (for example, a hydrocarbon group having 1 to 5 carbon atoms), and as the substituent, a methyl group is preferable.

Examples of the compound represented by Formula (C) include 1H-1,2,3-triazole, benzotriazole, and 5-methyl-1H-benzotriazole.

Examples of the substituted or unsubstituted tetrazole include an unsubstituted tetrazole, and a tetrazole having a hydroxyl group, a carboxyl group, or a substituted or unsubstituted amino group as a substituent. Here, the substituent in a case where the amino group is substituted is preferably an alkyl group having 1 to 6 carbon atoms, and more preferably an alkyl group having 1 to 3 carbon atoms.

The content of the corrosion inhibitor in the treatment liquid is preferably 0.01% to 5% by mass, more preferably 0.05% to 5% by mass, and still more preferably 0.1% to 3% by mass, with respect to the total mass of the treatment liquid.

The corrosion inhibitor may be used singly or in combination of two or more kinds thereof. In a case where two or more kinds of the corrosion inhibitors are used in combination, the total content thereof is preferably within the range.

<Content (B) of Calcium/Content (C) of Corrosion Inhibitor>

The mass content ratio of the calcium to the corrosion inhibitor (the content (B) of calcium/the content (C) of the corrosion inhibitor, hereinafter also referred to as "B/C") in the treatment liquid according to the embodiment is not particularly limited, but is preferably $1.0 \times 10^{-10}$ or more, and more preferably $6.0 \times 10^{-10}$ or more, and also preferably $1.0 \times 10^{-4}$ or less, more preferably $0.9 \times 10^{-5}$ or less, still more preferably $1.0 \times 10^{-6}$ or less, even still more preferably $1.0 \times 10^{-7}$ or less, and particularly preferably $2.0 \times 10^{-8}$ or less.

In a case where B/C is $1.0 \times 10^{-4}$ or less, the treatment liquid has more excellent corrosion resistance for Co.

In a case where B/C is $5.0 \times 10^{-10}$ or more, the treatment liquid has more excellent corrosion resistance.

On the other hand, in a case where B/C is $0.9 \times 10^{-5}$ or less, the treatment liquid has more excellent residue removing capability.

Furthermore, in a case where B/C is $1.0 \times 10^{-6}$ or less, the treatment liquid has more excellent residue removing capability and generation of defects is further suppressed.

In addition, in a case where B/C is $2.0 \times 10^{-8}$ or less, the treatment liquid has more excellent residue removing capability and generation of defects is further suppressed.

[Optional Components]

A treatment liquid according to another embodiment of the present invention may further contain optional components which will be described later.

<Organic Solvent>

It is preferable that the treatment liquid contains an organic solvent.

The organic solvent is not particularly limited, a known organic solvent can be used, and a hydrophilic organic solvent is preferable. Further, in the present specification, a hydrophilic organic solvent is intended to mean an organic solvent that is capable of dissolving 0.1 g or more in 100 g of water under the condition of 25° C., and as the hydrophilic organic solvent, an organic solvent which can be uniformly mixed with water at any ratio is preferable.

Examples of the organic solvent include an alcohol-based solvent, a ketone-based solvent, an ester-based solvent, an ether-based solvent, a sulfone-based solvent, a sulfoxide-based solvent, a nitrile-based solvent, and an amide-based solvent.

Examples of the alcohol-based solvent include an alkanediol (including, for example, alkylene glycol), an alkoxyalcohol (including, for example, glycol monoether), a saturated aliphatic monohydric alcohol, an unsaturated non-aromatic monohydric alcohol, and a low-molecular-weight alcohol including a ring structure.

Examples of the alkanediol include glycol, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycol.

Examples of the alkylene glycol include ethylene glycol, propylene glycol, diethylene glycol, dipropylene glycol, triethylene glycol, and tetraethylene glycol.

Examples of the alkoxyalcohol include 3-methoxy-3-methyl-1-butanol, 3-methoxy-1-butanol, 1-methoxy-2-butanol, and glycol monoether.

Examples of the saturated aliphatic monohydric alcohol include methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of the unsaturated non-aromatic monohydric alcohol include allyl alcohol, propargyl alcohol, 2-butenyl alcohol, 3-butenyl alcohol, and 4-penten-2-ol.

Examples of the low-molecular-weight alcohol including a ring structure include tetrahydrofurfuryl alcohol, furfuryl alcohol, and 1,3-cyclopentanediol.

Examples of the ether-based solvent include ethylene glycol monomethyl ether (EGME), ethylene glycol monoethyl ether, ethylene glycol mono-n-propyl ether, ethylene glycol monoisopropyl ether, ethylene glycol mono-n-butyl ether (EGBE), diethylene glycol monomethyl ether (DEGME), diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether. Among these, EGME, EGBE, or DEGME is preferable, and EGME is more preferable, in view of obtaining more excellent effects of the present invention.

Examples of the ketone-based solvent include acetone, propanone, cyclobutanone, cyclopentanone, cyclohexanone, diacetone alcohol, 2-butanone, 5-hexanedione, 1,4-cyclohexanedione, 3-hydroxyacetophenone, 1,3-cyclohexanedione, and cyclohexanone.

Examples of the ester-based solvent include ethyl acetate, glycol monoesters such as ethylene glycol monoacetate and diethyleneglycol monoacetate, and glycol monoether monoesters such as propylene glycol monomethyl ether acetate, ethylene glycol monomethyl ether acetate, propylene glycol monoethyl ether acetate, and ethylene glycol monoethyl ether acetate.

Examples of the sulfone-based solvent include sulfolane, 3-methyl sulfolane, and 2,4-dimethyl sulfolane.

Examples of the sulfoxide-based solvent include dimethyl sulfoxide.

Examples of the nitrile-based solvent include acetonitrile.

Examples of the amide-based solvent include N,N-dimethylformamide, 1-methyl-2-pyrrolidone, 2-pyrrolidinone, 1,3-dimethyl-2-imidazolidinone, ε-caprolactam, formamide, N-methylformamide, acetamide, N-methylacetamide, N,N-dimethylacetamide, N-methylpropaneamide, and hexamethylphosphoric triamide.

As the organic solvent, the ether-based solvent or the sulfoxide-based solvent is preferable in view that the corrosion resistance of the treatment liquid is more excellent, and the ether-based solvent is more preferable in view that the treatment liquid has more excellent corrosion resistance for $SiO_2$ and residue removing capability.

As the organic solvent, it is preferable to use a high-purity organic solvent having a small amount of inorganic ions such as such as a sulfate ion, a chloride ion, and a nitrate ion, and a metal ion, or to use the organic solvent after purification.

The content of metals other than calcium and lead in the organic solvent is preferably less than 0.001 ppt by mass.

Moreover, the organic solvent used in the embodiments of the present invention is preferably the above organic solvent.

For example, in a case where an organic solvent used in the organic solvent washing to be performed before and after a use of the treatment liquid is the above organic solvent, the effects of the present invention are more noticeably obtained.

Furthermore, from the viewpoint that desired effects for the treatment liquid are noticeably obtained, it is particularly preferable that the above-mentioned organic solvent is used as not only a treatment liquid but also a solvent used for washing of a housing container, or for a kit or the like which will be described later.

The content of the organic solvent is not particularly limited, and may be any one of 1% to 99.999% by mass with respect to the total mass of the treatment liquid.

The organic solvent may be used singly or in combination of two or more kinds thereof. In a case where two or more kinds of the organic solvents are used in combination, the total content thereof is preferably within the range.

<Water>

It is preferable that the treatment liquid contains water.

The water is not particularly limited, but ultrapure water for manufacturing a semiconductor is preferably used, and water obtained by further purifying the ultrapure water and reducing the amount of inorganic anions, metal ions, and the like is more preferably used. The purification method is not particularly limited, but purification using a filtering film or an ion exchange membrane, or purification using distillation is preferable. In addition, it is preferable that the purification is performed, for example, using the method described in JP2007-254168A.

The content of metals other than calcium and lead in the water is preferably less than 0.001 ppt by mass.

Furthermore, the water used in the embodiment of the present invention is preferably water obtained in the same manner as above.

For example, in a case where water used in the water washing to be performed before and after a use of the treatment liquid of the embodiment of the present invention is the above water, the effects of the present invention are more noticeably obtained.

Moreover, from the viewpoint that desired effects for the treatment liquid are noticeably obtained, it is particularly preferable that the above-mentioned water is used as not only a treatment liquid but also water used for washing of a housing container, or for a kit or the like which will be described later.

In a case where the treatment liquid contains water, the content of the organic solvent and the content of the water in the treatment liquid can be adjusted to provide the liquid properties with any of formulations such as a water-based formulation and a solvent-based formulation. In the present specification, a treatment liquid in which the content of the water in the treatment liquid is larger than the content of the organic solvent is defined as a "water-based treatment liquid", and a treatment liquid in which the content of the organic solvent in the treatment liquid is larger than the content of the water is defined as a "solvent-based treatment liquid".

(Water-Based Treatment Liquid)

In a case of using the water-based treatment liquid, it is preferable that the content of the water is 20% to 98% by mass with respect to the total mass of the treatment liquid, and the content of the organic solvent is 1% to 40% by mass with respect to the total mass of the treatment liquid.

In a case of using the water-based treatment liquid, the content of the water is preferably 35% to 98% by mass, and more preferably 50% to 95% by mass, with respect to the total mass of the treatment liquid.

In a case of using the water-based treatment liquid, the content of the organic solvent is preferably 5% to 35% by mass, and more preferably 10% to 30% by mass, with respect to the total mass of the treatment liquid.

(Solvent-Based Treatment Liquid)

In a case of using the solvent-based treatment liquid, it is preferable that the content of the water is 1% to 40% by mass with respect to the total mass of the treatment liquid, and the content of the organic solvent is 20% to 98% by mass with respect to the total mass of the treatment liquid.

In a case of using the solvent-based treatment liquid, the content of the water is preferably 1% to 30% by mass, more preferably 2% to 25% by mass, and still more preferably 4% to 20% by mass, with respect to the total mass of the treatment liquid.

In a case of using the solvent-based treatment liquid, the content of the organic solvent is preferably 40% to 98% by mass, more preferably 45% to 98% by mass, and still more preferably 50% to 95% by mass, with respect to the total mass of the treatment liquid.

In a case where the content of the water is 1% to 40% by mass and the content of the organic solvent is 40% to 98% by mass, with respect to the total mass of the treatment liquid, the treatment liquid has more excellent corrosion resistance for Co. Further, in this case, in a case where the content of the organic solvent is more than 58% by mass, the treatment liquid has more excellent corrosion resistance for tungsten, whereas in a case where the content of the organic solvent is more than 68% by mass, the treatment liquid has more excellent corrosion resistance for $SiO_2$. On the other hand, in a case where the content of the organic solvent is 58% by mass or less, the treatment liquid has more excellent residue removing capability.

The above tendency is more noticeable in a case where the fluorine-containing compound is "$NH_4F$".

<Lead (D)>

The treatment liquid may contain lead.

Lead may be in any form of an ion, a complex compound, a salt compound, an alloy, or the like. Further, lead may be in the form of particles.

Lead may be inevitably contained in the respective components (raw materials) included in the treatment liquid, may be inevitably incorporated into the treatment liquid during the production of the treatment liquid, and may be intentionally added to the treatment liquid and/or the raw materials.

The content of the lead in the treatment liquid is not particularly limited, but is preferably 0.1 ppt by mass or more, and more preferably 1 ppt by mass or more, preferably 10 ppb by mass or less, and more preferably 9 ppb by mass or less, with respect to the total mass of the treatment liquid.

In a case where the content of the lead is 10 ppb by mass or less, the treatment liquid has more excellent residue removing capability.

Furthermore, in a case where the content of the lead is 0.1 ppt by mass or more and less than 9 ppb by mass, generation of defects is further suppressed.

Furthermore, in the present specification, the content of the lead in the treatment liquid is intended to mean a content of lead, measured by the same method as for the above-mentioned content of calcium.

(Content (D) of Lead/Content (C) of Corrosion Inhibitor)

The mass content ratio of the lead to the corrosion inhibitor (the content (D) of lead/the content (C) of the corrosion inhibitor, hereinafter also referred to as "D/C") in the treatment liquid according to the embodiment is not particularly limited, but is preferably $6.0 \times 10^{-11}$ or more, and more preferably $1.0 \times 10^{-10}$ or more, and also preferably $1.0 \times 10^{-4}$ or less, more preferably less than $1.0 \times 10^{-6}$, still more preferably $1.0 \times 10^{-8}$ or less, and particularly preferably $2.0 \times 10^{-9}$ or less.

In a case where D/C is $0.6 \times 10^{-11}$ or more, the treatment liquid has more excellent residue removing capability and generation of defects is further suppressed.

On the other hand, in a case where D/C is less than $1.0 \times 10^{-6}$, the treatment liquid has more excellent residue removing capability.

Furthermore, in a case where D/C is $1.0 \times 10^{-8}$ or less, generation of defects is further suppressed.

<Inorganic Acid (E)>

The treatment liquid may contain an inorganic acid. The inorganic acid is a compound that is different from the above-mentioned fluorine-containing compound and corrosion inhibitor, and the fluorine-containing compound is excluded from the inorganic acid.

The inorganic acid is not particularly limited and a known inorganic acid can be used.

Examples of the inorganic acid include nitric acid, sulfuric acid, and hydrochloric acid, and among these, nitric acid is preferable.

The content of the inorganic acid in the treatment liquid is not particularly limited, but is preferably 0.01% by mass or more, and more preferably 0.1% by mass or more, and also preferably 20% by mass or less, more preferably 10% by mass or less, and still more preferably 3% by mass or less, with respect to the total mass of the treatment liquid.

In a case where the content of the inorganic acid is within the range, the treatment liquid has more excellent effects of the present invention.

The inorganic acid may be used singly or in combination of two or more kinds thereof. In a case where two or more kinds of the inorganic acids are used in combination, the total content thereof is preferably within the range.

(Content (D) of Lead/Content (E) of Inorganic Acid)

The mass content ratio of the lead to the inorganic acid (the content (D) of lead/the content (E) of the inorganic acid, hereinafter also referred to as "D/E") in the treatment liquid according to the embodiment is not particularly limited, but is preferably $1.0 \times 10^{-10}$ or more, and preferably $1.0 \times 10^{-4}$ or less, and also preferably less than $1.0 \times 10^{-4}$, and more preferably $1.0 \times 10^{-8}$ or less.

In a case where D/E is $1.0 \times 10^{-4}$ or less, the treatment liquid has more excellent residue removing capability.

In a case where D/E is less than $1.0 \times 10^{-4}$, it is presumed that excessive generation of sparingly soluble and/or insoluble salt compounds generated by lead and the inorganic acid is suppressed, and as a result, generation of defects is further suppressed.

In addition, in a case where D/E is $1.0 \times 10^{-10}$ or more, generation of defects is further suppressed.

(Content (E) of Inorganic Acid/Content (C) of Corrosion Inhibitor)

The mass content ratio of the inorganic acid to the corrosion inhibitor (the content (E) of the inorganic acid/the content (C) of the corrosion inhibitor, hereinafter also referred to as "E/C") in the treatment liquid according to the embodiment is not particularly limited, but is preferably 0.01 or more, and more preferably 0.1 or more, and also preferably 10 or less, and more preferably 1 or less.

In a case where E/C is within the range, the treatment liquid has more excellent effects of the present invention.

Furthermore, in a case where E/C is 10 or less, the treatment liquid has more excellent corrosion resistance for Co.

In addition, in a case where E/C is 0.1 to 1, generation of defects is further suppressed.

<Oxidizing Agent (F)>

It is preferable that the treatment liquid contains an oxidizing agent. The oxidizing agent is a compound that is different from the fluorine-containing compound, the corrosion inhibitor, and the inorganic acid.

The oxidizing agent is not particularly limited and a known oxidizing agent can be used.

As the oxidizing agent, for example, hydrogen peroxide, peroxide, iodate, periodate, hypochlorite, chlorite, chlorate, perchlorate, persulfate, dichromate, permanganate, ozonated water, a silver (II) salt, and an iron (III) salt, and among these, hydrogen peroxide is preferable.

The content of the oxidizing agent is not particularly limited, but is preferably 0.1% by mass or more, more preferably 1% by mass or more, and still more preferably 2% by mass or more, with respect to the total mass of the treatment liquid. The upper limit thereof is preferably 20% by mass or less, more preferably 15% by mass or less, still more preferably 10% by mass or less, and particularly preferably 3% by mass or less.

In a case where the content of the oxidizing agent is within the range, the treatment liquid has more excellent effects of the present invention.

Furthermore, the oxidizing agent may be used singly or in combination of two or more kinds thereof. In a case where two or more kinds of the oxidizing agents are used in combination, the total content thereof is preferably within the range.

(Content (E) of Inorganic Acid/Content (F) of Oxidizing Agent)

The mass content ratio of the inorganic acid to the oxidizing agent (the content (E) of the inorganic acid/the content (F) of the oxidizing agent, hereinafter also referred to as "E/F") in the treatment liquid according to the embodiment is not particularly limited, but is preferably 0.01 to 10.

In a case where E/F is within the range, the treatment liquid has more excellent effects of the present invention.

<Other Additives>

The treatment liquid may contain other additives other than the above components. Examples of such other additives include a pH adjusting agent, a silicon-based surfactant, and a fluorine-based surfactant.

Another suitable embodiment of the treatment liquid according to an embodiment of the present invention is a treatment liquid for a semiconductor device, containing $NH_4F$, a corrosion inhibitor, calcium, an organic solvent, and water, in which the mass content ratio of calcium to $NH_4F$ in the treatment liquid is $1.0 \times 10^{-10}$ to $1.0 \times 10^{-4}$, and the content of the water is 1% to 40% by mass and the content of the organic solvent (preferably EGME) is 20% to 98% by mass, with respect to the total mass of the treatment liquid. The treatment liquid has more excellent effects of the present invention. Incidentally, suitable embodiments of the respective components are as described above.

[Applications]

Next, the applications of the treatment liquid according to the embodiment will be described.

The treatment liquid is a treatment liquid for a semiconductor device. In the present specification, the expression, "for a semiconductor device" means a use in the manufacture of a semiconductor device. The treatment liquid can also be used in any steps for manufacturing a semiconductor device, and can also be used in treatments of, for example, an insulating film, a resist, an antireflection film, etching residues, and ashing residues, which are present on a substrate. Incidentally, in the present specification, the etching residues and the ashing residues are collectively referred to as residues.

The treatment liquid is used as a pre-wet liquid applied on a substrate in order to improve the coatability of an actinic ray-sensitive or radiation-sensitive composition before a step of forming a resist film using the composition; a resist removing liquid (peeling liquid) used for the removal of a resist which is at least one of a resist film or a residue of the resist film; a washing liquid (for example, a rinsing liquid) used for the removal of residues adhering onto a metal layer (containing, for example, Co or tungsten (W)) or an interlayer insulating film (containing, for example, $SiO_x$, SiN, or SiOC); a solution (for example, a removing liquid and a peeling liquid) used for the removal of various resist films for pattern formation; a solution (for example, a removing liquid and a peeling liquid) used for the removal of a permanent film (for example, a color filter, a transparent insulating film, and a resin-made lens) or the like from a semiconductor substrate; or the like. Further, the treatment liquid can also be used as a developer for various resists for pattern formation. In addition, the semiconductor substrate after the removal of the permanent film may be employed again in a use of a semiconductor device in some cases, and therefore, the removal of the permanent film is included in the step of manufacturing a semiconductor device.

The treatment liquid may be used only in one application or in two or more of the applications.

The treatment liquid can also be used in treatments of a substrate of a semiconductor device comprising a metal layer containing Co, a substrate of a semiconductor device comprising a metal layer containing W, or a substrate of a semiconductor device comprising a layer containing at least one selected from the group consisting of $SiO_x$, SiN, and SiOC.

The treatment liquid has the effects of the present invention as well as excellent corrosion resistance for a metal wiring and a plug (in the present specification, these are collectively referred to as a "metal layer"), and an interlayer insulating film, and therefore, it can be used for treatments of the substrates.

Among the above-mentioned applications of the treatment liquid, the treatment liquid of the embodiment of the present invention is suitably used for the removal of at least one of the residues of the resist film or the resist from the viewpoint that the effects of the treatment liquid are further exerted.

[Kit and Concentrate]

The treatment liquid may be used in the form of a kit having raw materials divided into a plurality of parts. Although not being particularly limited, examples of a specific method for using the treatment liquid in the form of the kit include an aspect in which a fluorine-containing compound is prepared as a first liquid, and a liquid composition containing the other components except for the fluorine-containing compound as a second liquid is prepared.

In addition, the treatment liquid may be prepared as a concentrate. In this case, it can be used after being diluted with water and/or an organic solvent at the time of use.

[Liquid Housing Body]

The liquid housing body contains the treatment liquid. Examples of the liquid housing body include a liquid housing body containing a container and a liquid, in which the liquid is a treatment liquid for a semiconductor device, containing a fluorine-containing compound, a corrosion inhibitor, and calcium, and the content of the calcium to the content of the fluorine-containing compound in the treatment liquid is $1.0 \times 10^{-10}$ to $1.0 \times 10^{-4}$.

In addition, the liquid may be in the form of the concentrate and/or the kit, instead of the treatment liquid.

The container is not particularly limited as long as it has no problem in corrosion properties due to the liquid, and a known container can be used.

As for the container, as a container exclusively used in semiconductor applications, a container which has high cleanliness in the container and less elution of impurities, is preferable.

Specific examples of the container include "CLEAN BOTTLE" series (manufactured by Aicello Chemical Co., Ltd.) and "PURE BOTTLE" (manufactured by Kodama Plastics Co., Ltd.). Further, for the purpose of prevention of impurity incorporation (contamination) into raw materials and chemicals, it is also preferable to use a multilayered container having a six-layer structure in which an inner wall of the container is formed of 6 kinds of resins, or a multilayered container having a seven-layer structure formed of six kinds of resins. Examples of these containers include, but are not limited to, the containers described in JP2015-123351A.

The inner wall of the container is preferably formed of or coated with one or more resins selected from the group consisting of a polyethylene resin, a polypropylene resin, and a polyethylene-polypropylene resin, other resins, and a metal such as stainless steel, Hastelloy, Inconel, and Monel.

As such other resins, a fluorine-based resin (perfluoro resin) can be preferably used. In this manner, by using a container having an inner wall formed of a fluorine-based resin or coated with the fluorine resin, occurrence of a problem of elution of ethylene or propylene oligomers can be suppressed, as compared with a case of using a container having an inner wall formed of a polyethylene resin, a polypropylene resin, or a polyethylene-polypropylene resin.

Specific examples of a container having such an inner wall include a FluoroPurePFA composite drum manufactured by Entegris Inc. Further, the containers described in page 4 of JP1991-502677A (JP-H03-502677A), page 3 of WO2004/016526A, pages 9 and 16 of WO99/046309A, or the like can also be used.

Moreover, for the inner wall of the container, the quartz and the electropolished metal material (that is, the metal material which has been completely electropolished) are also preferably used, in addition to the above-mentioned fluorine-based resin.

The metal material used for the production of the electropolished metal material is preferably a metal material which contains at least one selected from the group consisting of chromium and nickel, and has a total content of chromium and nickel of more than 25% by mass with respect to the total mass of the metal material. Examples of the metal material include stainless steel and a nickel-chromium alloy.

The total content of chromium and nickel in the metal material is preferably 25% by mass or more, and more preferably 30% by mass or more, with respect to the total mass of the metal material.

In addition, the upper limit value of the total content of chromium and nickel in the metal material is not particularly limited, but in general, it is preferably 90% by mass or less.

The stainless steel is not particularly limited, and known stainless steel can be used. Among those, an alloy containing 8% by mass or more of nickel is preferable, and austenitic stainless steel containing 8% by mass or more of nickel is more preferable. Examples of the austenitic stainless steel include Steel Use Stainless (SUS) 304 (content of Ni of 8% by mass, content of Cr of 18% by mass), SUS 304L (content of Ni of 9% by mass, content of Cr of 18% by mass), SUS 316 (content of Ni of 10% by mass, content of Cr of 16% by mass), and SUS 316L (content of Ni of 12% by mass, content of Cr of 16% by mass).

The nickel-chromium alloy is not particularly limited and a known nickel-chromium alloy can be used. Among those, a nickel-chromium alloy having a content of nickel of 40% to 75% by mass and a content of chromium of 1% to 30% by mass is preferable.

Examples of the nickel-chromium alloy include Hastelloy (trade name, hereinafter, the same shall apply), Monel (trade name, hereinafter, the same shall apply), and Inconel (trade name, hereinafter, the same shall apply). More specific examples thereof include Hastelloy C-276 (content of Ni of 63% by mass, content of Cr of 16% by mass), Hastelloy C (content of Ni of 60% by mass, content of Cr of 17% by mass), and Hastelloy C-22 (content of Ni of 61% by mass, content of Cr of 22% by mass).

In addition, the nickel-chromium alloy may further contain boron, silicon, tungsten, molybdenum, copper, cobalt, or the like, as desired, in addition to the above-mentioned alloys.

The method of electropolishing the metal material is not particularly limited, and known methods can be used. For example, the methods described in paragraphs [0011] to [0014] of JP2015-227501A, paragraphs [0036] to [0042] of JP2008-264929A, or the like can be used.

It is presumed that the metal material has a larger content of chromium in the passivation layer on the surface than the content of chromium in the parent phase by electropolishing the metal material. As a result, it is presumed that since it is difficult for the metal elements to flow into the treatment liquid from the inner wall coated with the electropolished metal material, it is possible to obtain a treatment liquid having a reduced amount of specific metal elements such as a Ca atom, a Fe atom, and a Na atom.

In addition, it is preferable that the metal material is buffed. The buffing method is not particularly limited, and known methods can be used. The size of the abrasive grain used to finish the buffing is not particularly limited, but is preferably #400 or less in view that the unevenness of the surface of the metal material is likely to be smaller.

Incidentally, buffing is preferably performed before the electropolishing.

In addition, the metal material may be subjected to a treatment including one of buffing, acid washing, magnetic fluid polishing, and the like or a combination of two or more thereof in a plurality of steps that are performed by changing the number of a size or the like of the abrasive grains.

For the container, it is preferable to wash the inside of the container before filling. The liquid used for washing may be appropriately selected depending on the application, but a liquid having a content of the calcium adjusted to be in the same range as that of the treatment liquid by purifying other organic solvents; the treatment liquid; a dilution of the treatment liquid; or a liquid including at least one of the components added to the treatment liquid is preferable.

In order to prevent the modifications in the components in the treatment liquid during the storage, the inside of the container may be purged with inert gas (nitrogen, argon, or the like) with a purity of 99.99995% by volume or more. In particular, a gas having a low moisture content is preferable. In addition, during the transportation or storage of a liquid housing body, the temperature may be controlled to a normal temperature in the range of −20° C. to 20° C. to prevent deterioration.

[Methods for Producing Treatment Liquid, Concentrate, Kit, and Liquid Housing Body]

A method for producing the treatment liquid is not particularly limited and a known production method can be used. Examples of the method for producing the treatment liquid include a method in which the respective components are mixed.

Furthermore, the mixing order of the respective components is not particularly limited. The concentrate and the kit are also preferably produced by the same method as above.

In addition, the liquid housing body can be produced by filling a treatment liquid produced by the method, a concentrate, and a kit into the container.

<Filtering Step>

In the production method, it is preferable that the content of the calcium included in the liquid is adjusted to be in desired ranges. In addition, it is preferable that the method includes a filtering step in which the liquid is filtered in order to remove foreign matters, coarse particles, and the like from the liquid.

The filtering method is not particularly limited and a known filtering method can be used. Above all, filtering using a filter is preferable.

As a filter used for filtering, any filter which has been used in the filtering applications or the like from the related art can be used without particular limitation. Examples of the materials constituting the filter include fluorine resins such as polytetrafluoroethylene (PTFE), polyamide-based resins such as nylon, and polyolefin resins (including a high-density polyolefin and an ultrahigh-molecular-weight polyolefin) such as polyethylene and polypropylene (PP). Among these materials, polyamide-based resins, PTFE, and polypropylene (including high-density polypropylene) are preferable.

By using a filter formed with these materials, high-polarity foreign matters which are likely to cause defects can be more effectively removed from the treatment liquid, and in addition, the content of the calcium in the treatment liquid can be more efficiently adjusted.

For the critical surface tension of the filter, the lower limit value is preferably 70 mN/m or more, and the upper limit value is preferably 95 mN/m or less. In particular, the critical surface tension of the filter is preferably from 75 mN/m to 85 mN/m.

In addition, the value of the critical surface tension is a nominal value of a manufacturer. By using a filter having a critical surface tension in the range, high-polarity foreign matters which are likely to cause defects can be more effectively removed from the treatment liquid, and in addition, the content of the calcium in the treatment liquid can be more efficiently adjusted.

The pore diameter of the filter is preferably approximately 0.001 to 1.0 μm, more preferably approximately 0.02 to 0.5 μm, and more preferably approximately 0.01 to 0.1 μm. By adjusting the pore diameter of the filter to be in the range, it is possible to reliably remove fine foreign matters contained in the treatment liquid while suppressing clogging in filtering.

In addition, from the viewpoint of more efficiently adjusting the content of the calcium in the treatment liquid, it is preferable that the pore diameter of the filter is set to 0.05 μm or less. The pore diameter of the filter in case of adjusting the content of the calcium is more preferably from 0.005 μm to 0.04 μm, and still more preferably from 0.01 μm to 0.02 μm.

With the pore diameter being in the range, the pressure required for filtering can be kept low, and filtering can be efficiently performed.

In a case of using filters, different filters may be combined. At that time, the filtering with the first filter may be performed once or twice or more times. In a case where the filtering is performed twice or more times by combining different filters, the respective filters may be of the same kinds or of different kinds from each other, and are preferably of different kinds from each other. Typically, it is preferable that the first filter and the second filter are different in at least one of the pore diameter or the constituent materials.

The pore diameter at the second filtering or later is preferably the same as or smaller than the pore diameter at the first filtering. In addition, the first filters with different pore diameters in the above-mentioned range may be combined. Here, with regard to the pore diameters, reference can be made to nominal values of filter manufacturers. A commercially available filter may be selected from various filters provided by Nihon Pall Ltd., Advantech Toyo Roshi Kaisha., Ltd., Nihon Entegris K. K. (formerly Nippon Microlith Co., Ltd.), Kitz Micro Filter Corporation, or the like, for example. Further, a polyamide-made P-nylon Filter (pore diameter of 0.02 μm, critical surface tension of 77 mN/m)"; (manufactured by Nihon Pall Ltd.), a high-density polyethylene-made "PE•clean filter (pore diameter of 0.02 μm)"; (manufactured by Nihon Pall Ltd.), and a high-density polyethylene-made "PE•clean filter (pore diameter of 0.01 μm)"; (manufactured by Nihon Pall Ltd.) can also be used.

As the second filter, a filter formed of the same materials as those of the first filter can be used. A filter having the same pore diameter as that of the above-mentioned first filter can be used. In a case of using the second filter having a smaller pore diameter than that of the first filter, the ratio of the pore diameter of the second filter to the pore diameter of the first filter (pore diameter of second filter/pore diameter of first filter) is preferably 0.01 to 0.99, more preferably 0.1 to 0.9, and still more preferably 0.3 to 0.9. By adjusting the pore diameter of the second filter to be in the range, fine foreign matters incorporated into the treatment liquid can be more reliably removed.

For example, filtering using a first filter may be performed with a mixed liquid including some components of the treatment liquid, the residual components may be mixed therewith to prepare a treatment liquid, and then filtering using second filtering may be carried out.

Moreover, the filter used is preferably treated before filtering the treatment liquid. The liquid used in this treatment is not particularly limited, but the liquid used for the treatment is preferably a liquid containing a treatment liquid, a concentrate, and the components contained in the treatment liquid.

In a case of performing filtering, the upper limit value in the temperature during the filtering is preferably room temperature (25° C.) or lower, more preferably 23° C. or lower, and still more preferably 20° C. or lower. Further, the lower limit value in the temperature during the filtering is preferably 0° C. or higher, more preferably 5° C. or higher, and still more preferably 10° C. or higher.

In the filtering, particulate foreign matters and/or impurities can be removed, but in a case of performing the filtering at the temperature, the amounts of the particulate foreign matters and/or impurities dissolved in the treatment liquid are reduced, and therefore, the filtering is more efficiently performed.

In particular, it is preferable that the treatment liquid containing an ultratrace amount of calcium is filtered at the above temperature. Although the mechanism is not clear, it is considered that most of the calcium is present in the particulate colloidal state. It is considered that in a case of performing filtering at the above temperature, some of the specific metal elements such as a Ca atom, a Fe atom, and a Na atom floating in the colloidal shape is aggregated, the aggregates are thus efficiently removed by filtering, and therefore, the content of the calcium is easily adjusted to be within a desired range.

<Charge Eliminating Step>

The production method may further contain a charge eliminating step in which at least one selected from the group consisting of a treatment liquid, a concentrate, a kit, and a container is subjected to charge elimination. Further, a specific method for charge elimination will be described later.

Moreover, it is preferable that all the steps in the production method are performed in clean rooms. The clean rooms preferably satisfy the standards of International Standards Organization (ISO) 14644-1 clean room, preferably satisfy any one of ISO Class 1, ISO Class 2, ISO Class 3, or ISO Class 4, more preferably satisfy either ISO Class 1 or ISO Class 2, and still more preferably satisfy ISO Class 1.

[Method for Washing Substrate]

The method for washing a substrate according to an embodiment of the present invention has a washing step B in which a predetermined substrate is washed using the treatment liquid. Further, the method for washing a substrate may have a treatment liquid preparing step A in which the treatment liquid is prepared before the washing step B.

In the following description of the method for washing a substrate, a case where the treatment liquid preparing step A is carried out before the washing step B is presented by way of an example, but is not restrictive, and the method for washing a substrate of the embodiment of the present invention may be performed using the treatment liquid that has been prepared in advance.

[Washing Target]

In an embodiment, it is preferable that the washing target in the method for washing a substrate comprises a metal layer containing Co.

Furthermore, in an embodiment, it is preferable that the washing target in the method for washing a substrate comprises a metal layer containing W.

Moreover, in an embodiment, it is preferable that the washing target in the method for washing a substrate comprises a layer containing at least one selected from the group consisting of $SiO_x$, SiN, and SiOC. Incidentally, x is a number of 1 to 3.

Examples of the washing target include a laminate comprising at least a metal layer, an interlayer insulating film, and a metal hard mask in this order on a substrate. The laminate may have holes formed toward the substrate from the surface (apertures) of the metal hard mask so as to expose the surface of the metal layer through a dry etching step or the like.

A method for producing such a laminate having holes is not particularly limited, but common examples thereof include a method in which a laminate before the treatment, having a substrate, a metal layer, an interlayer insulating film, and a metal hard mask in this order, is subjected to a dry etching step using the metal hard mask as a mask, and the interlayer insulating film is etched so as to expose the surface of the metal layer to provide holes passing through the inside of the metal hard mask and the interlayer insulating film.

Furthermore, a method for producing the metal hard mask is not particularly limited, and examples thereof include a method in which a metal layer including predetermined components is firstly formed on an interlayer insulating film, a resist film having a predetermined pattern is formed thereon, and then the metal layer is etched using the resist film as a mask to produce a metal hard mask (that is, a film with a metal layer that is patterned).

In addition, the laminate may have layers other than the above-mentioned layer, and examples of such other layers include an etching stop film and an antireflection layer.

FIG. 1 illustrates a schematic cross-sectional view showing an example of a laminate which is a washing target in the method for washing a substrate.

A laminate 10 shown in FIG. 1 comprises a metal layer 2, an etching stop layer 3, an interlayer insulating film 4, and a metal hard mask 5 in this order on a substrate 1, and has holes 6 formed by a dry etching step, through which the metal layer 2 is exposed at predetermined positions. That is, the washing target shown in FIG. 1 is a laminate comprising the substrate 1, the metal layer 2, the etching stop layer 3, the interlayer insulating film 4, and the metal hard mask 5 in this order, and comprising the holes 6 passing through the surface of the metal hard mask 5 at aperture positions thereof to the surfaces of the metal layer 2. The inner wall 11 of the hole 6 is formed of a cross-sectional wall 11a including the etching stop layer 3, the interlayer insulating film 4, and the metal hard mask 5, and a bottom wall 11b including the exposed metal layer 2, and dry etching residues 12 adhere thereto.

The method for washing a substrate can be suitably used in a washing intended to remove the dry etching residues 12. That is, the performance for removing the dry etching residues 12 (residue removing capability) is excellent, and the anticorrosion properties (corrosion resistance) for the inner wall 11 (for example, the metal layer 2) of the washing target are also excellent.

In addition, the method for washing a substrate may also be carried out for the laminate which has been subjected to a dry ashing step after the dry etching step.

Hereinafter, the respective layer constituent materials of the above-mentioned laminate will be described.

<Metal Hard Mask>

It is preferable that the metal hard mask contains at least one component selected from the group consisting of Cu, Co, W, $AlO_x$, AlN, $AlO_xN_y$, $WO_x$, Ti, TiN, $ZrO_x$, $HfO_x$, and $TaO_x$. Here, x and y each preferably represent numbers represented by x=1 to 3 and y=1 to 2.

Examples of the materials of the metal hard mask include TiN, $WO_2$, and $ZrO_2$.

<Interlayer Insulating Film>

A material for the interlayer insulating film is not particularly limited, and examples thereof include a material, preferably having a dielectric constant k of 3.0 or less, and more preferably having a dielectric constant k of 2.6 or less.

Specific examples of the material for the interlayer insulating film include $SiO_x$, SiN, SiOC, and organic polymers such as a polyimide. Incidentally, x is preferably a number represented by 1 to 3.

<Etching Stop Layer>

A material for the etching stop layer is not particularly limited. Specific examples of the material for the etching stop layer include SiN-, SiON-, and SiOCN-based materials, and metal oxides such as $AlO_x$. Incidentally, x is preferably a number that is more than 0 and less than 3.

<Metal Layer>

It is preferable that a material forming the metal layer contains cobalt and/or tungsten. Moreover, cobalt and/or tungsten may be an alloy with other metals.

The wiring material of the present invention may further contain metals other than cobalt, metal nitride, or an alloy. Specific examples thereof include copper, titanium, titanium-tungsten, titanium nitride, tungsten, tantalum, tantalum compounds, chromium, chromium oxide, and aluminum.

<Substrate>

A term "substrate" as mentioned herein includes, for example, a semiconductor substrate including a single layer, and examples thereof include a semiconductor substrate including multiple layers.

A material constituting the semiconductor substrate including a single layer is not particularly limited, and in general, the semiconductor substrate is preferably formed of silicon, silicon germanium, Group III to V compounds such as GaAs, and any combinations thereof.

In a case of a semiconductor substrate including multiple layers, its configuration is not particularly limited, and the substrate may have, for example, exposed integrated circuit structures such as interconnect structures (interconnect features) such as a metal wire and a dielectric material on the semiconductor substrate such as silicon as described above. Examples of the metals and the alloys used in the interconnect structures include, but are not limited to, aluminum, aluminum alloyed with copper, copper, titanium, tantalum, cobalt, silicon, titanium nitride, tantalum nitride, and tungsten. Further, there may be an interlayer dielectric layer, a silicon oxide layer, a silicon nitride layer, a silicon carbide layer, a carbon-doped silicon oxide layer, or the like on the semiconductor substrate.

Hereinafter, each of the steps in the method for washing a substrate will be described.

[Treatment Liquid Preparing Step A]

The treatment liquid preparing step A is a step of preparing the treatment liquid. The respective components used in the present step are as described above.

The procedure in the present step is not particularly limited, and examples thereof include a method in predetermined components are stirred and mixed to prepare a treatment liquid. Further, the respective components may be added at once or may be added in portions over a plurality of times.

In addition, as the respective components included in the treatment liquid, those classified into a semiconductor grade or those classified into a high-purity grade equivalent thereto are preferably used. Further, as for components having a large amount of impurities at the time of the raw materials, it is preferable to use the components obtained after performing removal of foreign matters by filtering and reduction in ion components with ion exchange resins or the like.

[Washing Step B]

Examples of a washing target to be washed in the washing step B include the above-mentioned laminate, and examples thereof include the laminate 10 having holes formed by carrying out a dry etching step as described above (see FIG. 1). Further, the dry etching residues 12 adhere to the inside of the holes 6 in the laminate 10.

In addition, the laminate which has been subjected to a dry ashing step after the dry etching step may be used as a washing target.

A method for bringing the treatment liquid into contact with the washing target is not particularly limited, but examples thereof include a method in which a washing target is immersed in a treatment liquid contained in a tank, a method in which a treatment liquid is sprayed onto a washing target, a method in which a treatment liquid is flowed onto a washing target, and any combinations thereof. From the viewpoint of the residue removing capability, the method in which a washing target is immersed in a treatment liquid is preferable.

A temperature of the treatment liquid is preferably set to 90° C. or lower, more preferably set to 25° C. to 80° C., still more preferably set to 30° C. to 75° C., and particularly preferably set to 40° C. to 65° C.

The washing time can be adjusted depending on the washing method used and the temperature of a treatment liquid.

In a case where washing is performed in an immersion batch mode (a batch mode in which a plurality of sheets of washing targets are immersed in a treatment tank to perform a treatment), the washing time is, for example, 60 minutes or less, preferably 1 to 60 minutes, more preferably 3 to 20 minutes, and still more preferably 4 to 15 minutes.

In a case where sheet-type washing is performed, the washing time is, for example, 10 seconds to 5 minutes, preferably 15 seconds to 4 minutes, more preferably 15 seconds to 3 minutes, and still more preferably 20 seconds to 2 minutes.

Furthermore, in order to enhance the washing capability of the treatment liquid, a mechanical stirring method may be used.

Examples of the mechanical stirring method include a method in which a treatment liquid is circulated on a washing target, a method in which a treatment liquid is flowed through or sprayed on a washing target, and a method in which a treatment liquid is stirred with an ultrasonic or a megasonic.

[Rinsing Step B2]

The method for washing a substrate may further contain a rinsing step B2 in which the washing target is cleaned by rinsing with a solvent after the washing step B.

The rinsing step B2 is preferably a step which is performed subsequently after the washing step B, and rinsing is performed with a rinsing solvent (rinsing liquid) over 5 seconds to 5 minutes. The rinsing step B2 may be performed using the above-mentioned mechanical stirring method.

Examples of the rinsing solvent include, but are not limited to, deionized water, methanol, ethanol, isopropyl alcohol, N-methylpyrrolidinone, γ-butyrolactone, dimethyl sulfoxide, ethyl lactate, and propylene glycol monomethyl ether acetate. Alternatively, an aqueous rinsing liquid (diluted aqueous ammonium hydroxide or the like) with a pH>8 may be used.

As the rinsing solvent, an aqueous ammonium hydroxide solution, deionized water, methanol, ethanol, and isopropyl alcohol are preferable, an aqueous ammonium hydroxide solution, deionized water, and isopropyl alcohol are more preferable, and an aqueous ammonium hydroxide solution and deionized water are still more preferable.

As a method for bringing the rinsing solvent into contact with the washing target, the above-mentioned method in which the treatment liquid is brought into contact with a washing target can be applied in the same manner.

The temperature of the rinsing solvent in the rinsing step B2 is preferably 16° C. to 27° C.

The above-mentioned treatment liquid may be used as a rinsing solvent in the rinsing step B2.

[Drying Step B3]

The method for washing a substrate may contain a drying step B3 in which the washing target is dried after the rinsing step B2.

The drying method is not particularly limited. Examples of the drying method include a spin drying method, a method of flowing a dry gas onto a washing target, a method of heating a substrate by a heating means such as a hot plate or an infrared lamp, a Marangoni drying method, a Rotagoni drying method, an isopropyl alcohol (IPA) drying method, or any combinations thereof.

The drying time depends on a specific method used, but in general, is preferably 30 seconds to several minutes.

[Ion Removing Steps F and G]

The method for washing a substrate according to an embodiment of the present invention is the method for washing a substrate, containing an ion removing step F in which calcium ions are removed from at least one selected from the group consisting of the fluorine-containing compound and the corrosion inhibitor before the treatment liquid preparing step A, and/or an ion removing step G in which calcium ions in the treatment liquid are removed before the washing step B after the treatment liquid preparing step A. Examples thereof include a method for washing a substrate, having the ion removing step F, the treatment liquid preparing step A, the ion removing step G, and the washing step B in this order, a method for washing a substrate, having the ion removing step F, the treatment liquid preparing step A, and the washing step B in this order, and a method for washing a substrate, having the treatment liquid preparing step A, the ion removing step G, and the washing step B in this order.

It is preferable that the content of the calcium to the content of the fluorine-containing compound in the treatment liquid used in the washing step B is adjusted to be in the above-mentioned range by carrying out at least one of the ion removing step F or the ion removing step G. In particular, there is an advantage in that the content of the calcium to the content of the fluorine-containing compound is easily adjusted to be in the above-mentioned range by carrying out both the ion removing step F and the ion removing step G.

Furthermore, it is possible to maintain good washing performance of the treatment liquid even after the passage of time by adjusting the content of the calcium to the content of the fluorine-containing compound in the treatment liquid to be in the range, which is thus excellent in recyclability.

Specific methods for the ion removing step F and the ion removing step G are not particularly limited, but examples thereof include purification by distillation and/or an ion exchange membrane.

In a case where water is used during the preparation of the treatment liquid in the treatment liquid preparing step A, the ion removing step F is preferably a step in which calcium ions are removed from at least one selected from the group consisting of the fluorine-containing compound, the corrosion inhibitor, and water. In this manner, it becomes easier to adjust the content of the calcium to the content of the fluorine-containing compound in the treatment liquid used in the washing step B to be in the above-mentioned range.

[Coarse Particle Removing Step H]

The method for washing a substrate preferably has a coarse particle removing step H in which the coarse particles in the treatment liquid are removed, before the washing step B after the treatment liquid preparing step A.

By reducing or removing the coarse particles in the treatment liquid, it is possible to reduce the amount of the coarse particles remaining on the washing target obtained after performing the washing step B. As a result, it is possible to suppress pattern damages caused by the coarse particles on the washing target, and an influence on a yield loss of a device and a decrease in reliability can also be suppressed.

Specific examples of a method for removing the coarse particle include a method in which the treatment liquid obtained after performing the treatment liquid preparing step A is purified by filtering, using a particle removing film having a predetermined particle removal diameter.

In addition, the definition of the coarse particles is as described above.

[Charge Eliminating Steps I and J]

It is preferable that the method for washing a substrate uses water during the preparation of the treatment liquid in the treatment liquid preparing step A, and contains at least one step selected from the group consisting of a charge eliminating step I in which the water is subjected to charge elimination before the treatment liquid preparing step A, and a charge eliminating step J in which the treatment liquid is subjected to charge elimination before the washing step B after the treatment liquid preparing step A. Examples of the method include a method for washing a substrate, having the charge eliminating step I, the treatment liquid preparing step A, the charge eliminating step J, and the washing step B in this order, a method for washing a substrate, having the charge eliminating step I, the treatment liquid preparing step A, and the washing step B in this order, and a method for washing a substrate, having the treatment liquid preparing step A, the charge eliminating step J, and the washing step B in this order.

It is preferable that a material for a liquid contact portion for supplying the treatment liquid to the washing target is formed of or coated with a material having no metal elution to the treatment liquid in order to maintain the content of the calcium to the content of the fluorine-containing compound in the treatment liquid to be within a predetermined range. The material includes a material for an inner wall of a container that can be used in a liquid housing body, and examples thereof include the materials described above.

Moreover, the material may be a resin. In a case where the material is the resin, the resin has a low electrical conductivity and insulating properties in many cases. Therefore, in a case where the treatment liquid is allowed to pass through a pipe having an inner wall formed of or coated with the resin, or a case where purification by filtering is performed with a resin-made particle removing film and a resin-made ion exchange resin film, there is a possibility that the charge potential of the treatment liquid increases, and thus causes electrostatic hazards.

As a result, it is preferable that in the method for washing a substrate of the embodiment of the present invention, at least one step of the above-mentioned charge eliminating step I or charge eliminating step J is carried out to reduce the charging potential of the treatment liquid. Further, by performing charge elimination, adherence of foreign matters (coarse particles or the like) onto a substrate and/or damages (corrosion) on the washing target can be further suppressed.

Specific examples of the charge eliminating method include a method in which water and/or the treatment liquid is brought into contact with an electrically conductive material.

The contact time during which water and/or the treatment liquid is brought into contact with the electrically conductive material is preferably 0.001 to 1 second, and more preferably 0.01 to 0.1 seconds.

Specific examples of the resin include high-density polyethylene (HDPE), high-density polypropylene (PP), 6,6-nylon, tetrafluoroethylene (PTFE), a tetrafluoroethylene/perfluoroalkylvinyl ether copolymer (PFA), polychlorotrifluoroethylene (PCTFE), an ethylene/chlorotrifluoroethylene copolymer (ECTFE), an ethylene/ethylene tetrafluoride copolymer (ETFE), and an ethylene tetrafluoride/propylene hexafluoride copolymer (FEP).

Examples of the electrically conductive material include stainless steel, gold, platinum, diamond, and glassy carbon.

The method for washing a substrate according to an embodiment of the present invention is a method for washing a substrate, containing a treatment liquid preparing step A, a washing step B, a drainage recovering step C in which drainage of the treatment liquid used in the washing step B is recovered, a washing step D in which a newly prepared substrate comprising a predetermined layer is washed with the recovered drainage of the treatment liquid, a drainage recovering step E in which drainage of the treatment liquid used in the washing step D is recovered, and a step of repeating the washing step D and the drainage recovering step E.

In the method for washing a substrate according to the embodiment, the aspects of the treatment liquid preparing step A and the washing step B are as described above. Further, in an aspect of reusing the drainage, it is preferable that the method has the ion removing steps F and G described in the above-mentioned aspect, the coarse particle removing step H, and the charge eliminating steps I and J. Further, the method may have the treatment liquid preparing step A described in the above-mentioned aspect before the washing step B.

An aspect of the washing step D in which the washing of the substrate is performed using the recovered drainage of the treatment liquid is as described above.

A drainage recovering means in the drainage recovering steps C and E is not particularly limited. The recovered drainage is preferably stored in the above-mentioned container in the charge eliminating step J, and the same charge eliminating step as the charge eliminating step J may be performed at this time. In addition, a step in which the recovered drainage is subjected to filtering or the like to remove impurities may be provided.

[Method for Removing Resist]

The method for removing a resist according to an embodiment of the present invention contains a step of removing a resist which is at least one selected from the group consisting of the resist film and the residue of the resist film using the above-mentioned treatment liquid (hereinafter also referred to as a "resist removing step"). In the present specification, "removal of a resist" means "removing" a resist from a substrate having the resist provided thereon, or the like, and encompasses "removal of a resist by peeling", "removal of a resist by dissolution", or the like.

The resist film is provided, for example, at a position corresponding to the metal hard mask 5 contained in the laminate 10 of FIG. 1 as described above. That is, the resist film is provided on the substrate 1, instead of the metal hard mask 5.

The method for removing a resist according to the embodiment may be used for the removal of the resist film formed as above, and may also be used for the removal of the generated residues (also including by-products) by subjecting the resist film to etching (dry etching such as plasma etching) and/or ashing (dry ashing such as plasma ashing), or the like.

<Resist>

In the removal of the resist using the treatment liquid, the resist film to be treated is not particularly limited, but examples thereof include a positive tone photoresist, a negative tone photoresist, and a combined positive-negative tone photoresist.

Specific examples of the positive tone resist include a (meth)acrylate-based resin, a vinyl cinnamate-based resin, a cyclized polyisobutylene-based resin, an azo-novolac-based resin, a diazoketone-novolac-based resin, and at least one resin of a novolac-based resin or a polyhydroxystyrene-based resin.

Specific examples of the negative tone resist include an azido-cyclized polyisoprene-based resin, an azido-phenolic resin, and a chloromethyl polystyrene-based resin. Furthermore, specific examples of the combined positive-negative tone resist include a poly(p-butoxycarbonyloxystyrene)-based resin.

With reference to other examples of the resist for patterning, reference can be made to those disclosed in each of the publications of JP5222804B, JP5244740B, JP5244933B, JP5286236B, JP5210755B, JP5277128B, JP5303604B, JP5216892B, JP5531139B, JP5531078B, and JP5155803B, the contents of which are hereby incorporated by reference.

<Resist Removing Step>

The resist removing step is carried out by bringing the treatment liquid into contact with the resist. This method is not particularly limited, but examples thereof include a method in which a laminate having a resist is immersed in a treatment liquid contained in a tank, a method in which a treatment liquid is sprayed onto a resist, a method in which a treatment liquid is flowed onto a resist, or any combinations thereof. From the viewpoint that resist removing capability is further improved, the method in which a washing target is immersed in a treatment liquid is preferable.

The temperature of the treatment liquid in the resist removing step is preferably 80° C. or lower, more preferably 10° C. to 70° C., and still more preferably 20° C. to 65° C.

A resist removing duration (a duration for which a resist and a treatment liquid are in contact with each other in the resist removing step) can be adjusted depending on a removing method used, the temperature of the treatment liquid, or the like, and is usually 10 seconds to 10 minutes, and preferably 30 seconds to 5 minutes.

In order to further enhancing the resist removing capability of the treatment liquid, a mechanical stirring method may be used. The mechanical stirring method is as described in the section of the above-mentioned substrate washing method, and therefore, a description thereof is omitted.

The method for removing a resist of the embodiment of the present invention may have a drying step in which members constituting a semiconductor device, such as a substrate having a resist provided thereon, are dried after the resist removing step.

The drying method is not particularly limited, and examples thereof include the same method as that of the drying step B3 in the above-mentioned method for washing a substrate, and therefore, a description thereof is omitted.

Examples

Hereinbelow, the present invention will be described in more detail with reference to Examples. The materials, the amounts and proportions of materials to be used, the treatment details, the treatment procedure, or the like shown in Examples below may be modified as appropriate as long as the modifications do not depart from the spirit of the present invention. Therefore, the scope of the present invention should not be construed as being limited to Examples shown below.

[Preparation of Treatment Liquid]

In the preparation of each of the treatment liquids of Examples and Comparative Examples, the organic solvent and water were subjected to purification by the method described in JP2007-254168A, and used for the preparation of the treatment liquid.

The respective components shown in Table 1 were mixed and stirred to obtain a mixed liquid, and then at least one of a filtering treatment or a filtration treatment of the mixed liquid was performed to obtain each of the treatment liquids of Examples and Comparative Examples. Further, the number of times of each treatment was modified as appropriate such that the content of the calcium included in the treatment liquid of each of Examples and Comparative Examples became the content as described in Table 1, and then the treatment was performed.

Furthermore, the concentration of calcium in the treatment liquid was controlled by removing Ca through the filtering. More specifically, a circulation line (circulation filtering line) was formed using IEX PTFE having a pore size of 15 nm, manufactured by Entegris Inc., at the first stage, and subsequently using PTFE having a pore size of 12 nm, manufactured by Entegris Inc., at the second stage. In the purification, this circulation filtering line was used, and circulation was performed once to ten times. It was confirmed that as the number of times of the circulation increases, the concentration of Ca can be reduced.

In addition, the pH of each of the treatment liquids was adjusted using a pH adjusting agent such that the pH of each of the treatment liquids became a predetermined value described in Table 1. The components used for the preparation of each of the treatment liquids of Examples and Comparative Examples are as follows.

[Fluorine-Containing Compound (A)]
HF: Hydrofluoric acid
TMAF: Tetramethylammonium fluoride
$H_2SiF_6$: Hexafluorosilicic acid
$HBF_4$: Tetrafluoroboric acid
$HPF_6$: Hexafluorophosphoric acid
[Corrosion Inhibitor]
5-MBTA: 5-Methyl-1H-benzotriazole
ABA: Anthranilic acid
PAA: Polyacrylic acid (weight-average molecular weight: 25000)
BTA: Benzotriazole
TAZ: 1,2,4-Triazole
DdA: Dodecanoic acid
FS-3PG: NEWKALGEN FS-3PG (anionic surfactant, manufactured by Takemoto Yushi Co., Ltd.)
HLP-1: PHOSTEN HLP-1 (anionic surfactant, manufactured by Nikko Chemicals Co., Ltd.)
$CeCl_3$: Cerium chloride
TGC: Thioglycerol
TMA: Mercaptosuccinic acid (thiomalic acid)
Cys: L-Cysteine
SBTL: Sorbitol
MPA: Mercaptopropionic acid
[Water]
Ultrapure water
[Organic Solvent]
EGME (Ethylene glycol monomethyl ether)
EGBE (Ethylene glycol mono-n-butyl ether)
DEGME (Diethylene glycol monomethyl ether)
MSA (Methanesulfonic acid)

[Inorganic Acid]
HNO$_3$: Nitric acid
[Oxidizing Agent]
H$_2$O$_2$: Hydrogen peroxide
[Measurement of Content of Calcium and Content of Lead in Treatment Liquid]

Measurement of the content of the calcium and the content of the lead in the treatment liquid was performed by the following method.

First, 1,000 mL of the treatment liquid of each of Examples and Comparative Examples was put into a synthetic quartz-made container, and heated for ashing so as to maintain the boiling state using a muffle furnace, and the ashed sample was dissolved in ultrapure water to manufacture a sample solution. The sample solution was measured using high-frequency inductively coupled plasma optical emission spectrometry (ICP-MS, ICPMS-2030 manufactured by Shimadzu Corporation). Further, the measurement results are summarized in Table 1.

[Measurement of Viscosity Characteristics of Treatment Liquid]

$\eta_1$ and $\eta_2$ were determined by the following method.

A viscosity $\eta_2$ (at a rotor rotation speed of 1,000 rpm) and a viscosity $\eta_1$ (at a rotor rotation speed of 100 rpm) at 23° C. were measured using each of the treatment liquids of Examples and Comparative Examples. The ratio (viscosity $\eta_1/\eta_2$) of the viscosity was calculated from the obtained value. For the measurement of the viscosity, a viscometer "Brookfield viscometer EV-3T" (trade name, manufactured by EKO Seiki Co., Ltd.) was used.

[Measurement of pH]

The pH of each of the treatment liquids of Examples and Comparative Examples at 25° C. was measured using a pH meter (trade name "a desktop type pH meter F-74BW", manufactured by HORIBA Ltd.).

[Evaluation Test 1: Evaluation of Corrosion Resistance (Anticorrosion Properties)]

A film formed of Co (hereinafter also referred to as a "Co film") was prepared, and evaluated on the corrosion resistance, based on the etching rates thereof. The film thickness of the Co film is 1,000 Å (1 Å represents 0.1 nm).

As the etching rate is lower, the treatment liquid has more excellent corrosion resistance for the Co film.

The Co film was subjected to an etching treatment using each of the treatment liquids of Examples and Comparative Examples. Specifically, the Co film was immersed in the treatment liquid of each of Examples and Comparative Examples for 10 minutes, and the etching rate (Å/min) was calculated, based on a difference in the film thickness of the Co film between before and after the immersion in the treatment liquid.

Furthermore, the film thickness of the Co film before and after the treatment was measured using ellipsometry (spectroscopic ellipsometer, trade name "Vase", manufactured by J. A. Woollam Co.) under the conditions of a measuring range of 250 to 1,000 nm and measuring angles of 70 degrees and 75 degrees.

Moreover, a film including W and a film including SiO$_2$ were prepared, and the etching rates were calculated in the same manner as above.

In addition, the results were evaluated in accordance with the following standard depending on each of the films, and the measurement results and evaluations are summarized in Table 1.

<Corrosion Resistance for Co Film>
A: The etching rate of the Co film is less than 20 Å/min.
B: The etching rate of the Co film is 20 Å/min or more and less than 30 Å/min.
C: The etching rate of the Co film is 30 Å/min or more and less than 40 Å/min.
D: The etching rate of the Co film is 40 Å/min or more and less than 50 Å/min.
E: The etching rate of the Co film is 50 Å/min or more and less than 60 Å/min.
F: The etching rate of the Co film is 60 Å/min or more.

Furthermore, the corrosion resistance for the Co film, "A" to "E" is preferable in practical use.

<Corrosion Resistance for W Film>
A: The etching rate of the W film is less than 10 Å/min.
B: The etching rate of the W film is 10 Å/min or more and less than 20 Å/min.
C: The etching rate of the W film is 20 Å/min or more and less than 30 Å/min.
D: The etching rate of the W film is 30 Å/min or more.

<Corrosion Resistance for SiO$_2$ Film>
A: The etching rate of the SiO$_2$ film is less than 10 Å/min.
B: The etching rate of the SiO$_2$ film is 10 Å/min or more and less than 20 Å/min.
C: The etching rate of the SiO$_2$ film is 20 Å/min or more.

[Evaluation Test 2: Evaluation of Residue Removing Capability]

For the residue removing capability, a model film formed of titanium oxide (TiO$_2$), which was one of residues produced during the plasma etching of the metal hard mask, was prepared, and the etching rate was evaluated. That is, in a case where the etching rate is high, it can be said that the treatment liquid has more excellent residue removing capability (also referred to as "residue dissolving properties").

For the measurement of the etching rate of titanium oxide, the thickness of the titanium oxide film was measured after immersing a model substrate (manufactured by Advanced Materials Technology, Inc.) having a titanium oxide film with a film thickness of 1,000 Å formed on a silicon wafer for 5 minutes in the treatment liquid of each of Examples and Comparative Examples prepared by the method, and the reduced thickness of the titanium oxide film between before and after the immersion was calculated and divided by 5 minutes to obtain a titanium oxide dissolution rate in the treatment liquid per unit time (min). Here, the film thickness was measured using ellipsometry (spectroscopic ellipsometer, "MS-2000" manufactured by J. A. Woollam Co.) under a measuring range of 250 to 1,000 nm and measuring angles of 70 degrees and 75 degrees.

Evaluation of the residue removing capability (residue dissolving properties) was performed in accordance with the following standard, and the results are shown in Table 1. Further, "A" to "C" are preferable in practical use.

A: The etching rate is 5 Å/min or more.
B: The etching rate is 3 Å/min or more and less than 5 Å/min.
C: The etching rate is 1 Å/min or more and less than 3 Å/min.
D: The etching rate is more than 0 Å/min and less than 1 Å/min.
E: Not dissolved at all.

[Evaluation Test 3: Evaluation of Defect Performance]

The number of foreign matters with a diameter of 32 nm or more present on the surface of the silicon substrate with a diameter of 300 mm, and the address of each of the foreign matters were measured using a wafer surface inspection device (SP-5, manufactured by KLA-Tencor Corporation).

Further, a wafer for which the number of foreign matters present on the surface of the silicon substrate had been counted was set up in a spinning wafer treatment device (manufactured by EKC Technology, Inc.).

Next, each of the treatment liquids of Examples and Comparative Examples was jetted onto the surface of the set wafer for 1 minute at a flow rate of 1.5 L/min. Thereafter, the wafer was spin-dried.

For the obtained wafer after drying, the number of the foreign matters on the wafer and the positions where the foreign matters had been generated were measured using the wafer surface inspection device.

Furthermore, for the newly increased foreign matters after spin-drying the treatment liquid, elemental analysis by energy dispersive X-ray (EDX) spectrometry was performed using a defect analyzer (SEM VISION G6, manufactured by APPLIED MATERIALS, Inc.). Calcium and lead were used as target metal elements, and foreign matters containing the target metal elements were counted as particles. The number of the particles thus obtained was evaluated in accordance with the following evaluation standard. The results are shown in Table 1. Further, "A" to "C" are preferable in practical use.

A: The number of particles with a diameter of 32 nm or more containing the target metal elements is 0 or more and less than 100.
B: The number of particles with a diameter of 32 nm or more containing the target metal elements is 100 or more and less than 500.
C: The number of particles with a diameter of 32 nm or more containing the target metal elements is 500 or more and less than 1,000.
D: The number of particles with a diameter of 32 nm or more containing the target metal elements is 1,000 or more.

Furthermore, in Table 1, the components of the treatment liquid, evaluations, and the like in the respective Examples are summarized on each first row of each table. Incidentally, Table 1 (Table 1-1) and Table 1 (Table 1-2) are horizontally linked, and for example, the components for the treatment liquid, evaluations, or the like in Example 1 are shown on the first rows of Table 1 (Table 1-1) and Table 1 (Table 1-2). This also applies to Table 1 (Table 2-1) and Table 1 (Table 2-2). That is, evaluations and the like for the treatment liquid of Example 48 are shown on the first row of each of Table 1 (Table 2-1) and Table 1 (Table 2-2).

TABLE 1

| Table 1 (Table 1-1) | Fluorine-containing compound (A) Type | Content | Ca content (B) ppt by mass | Corrosion inhibitor (C) Type | Content | Pb content (D) ppt by mass |
|---|---|---|---|---|---|---|
| Example 1 | HF | 1.0% | 10 | 5-MBTA | 1.0% | 1 |
| Example 2 | HF | 0.5% | 10 | 5-MBTA | 1.0% | 1 |
| Example 3 | HF | 1.5% | 10 | 5-MBTA | 1.0% | 1 |
| Example 4 | HF | 1.0% | 10 | 5-MBTA | 10.0% | 1 |
| Example 5 | HF | 1.0% | 10 | 5-MBTA | 0.00001% | 1 |
| Example 6 | HF | 1.0% | 1000 | 5-MBTA | 1.0% | 1 |
| Example 7 | HF | 1.0% | 100 | 5-MBTA | 0.00001% | 1 |
| Example 8 | TMAF | 1.0% | 10 | 5-MBTA | 1.0% | 1 |
| Example 9 | $H_2SiF_6$ | 1.0% | 10 | 5-MBTA | 1.0% | 1 |
| Example 10 | $HBF_4$ | 1.0% | 10 | 5-MBTA | 1.0% | 1 |
| Example 11 | $HPF_6$ | 1.0% | 10 | 5-MBTA | 1.0% | 1 |
| Example 12 | HF | 1.0% | $9.0 \times 10^4$ | 5-MBTA | 1.0% | $9.0 \times 10^3$ |
| Example 13 | HF | 1.0% | $1.0 \times 10^5$ | 5-MBTA | 1.0% | $1.0 \times 10^4$ |
| Example 14 | HF | 1.0% | 10 | 5-MBTA | 1.0% | 1 |
| Example 15 | HF | 1.0% | 10 | 5-MBTA | 1.0% | 1 |
| Example 16 | HF | 1.0% | 10 | 5-MBTA | 1.0% | 1 |
| Example 17 | HF | 1.0% | 10 | 5-MBTA | 1.0% | 1 |
| Example 18 | HF | 1.0% | 10 | 5-MBTA | 1.0% | 1 |
| Example 19 | HF | 1.0% | 10 | 5-MBTA | 1.0% | 1 |
| Example 20 | HF | 1.0% | 10 | 5-MBTA | 1.0% | 1 |
| Example 21 | HF | 1.0% | 10 | 5-MBTA | 1.0% | 1 |
| Example 22 | HF | 1.0% | 10 | 5-MBTA | 1.0% | 1 |
| Example 23 | HF | 1.0% | 10 | 5-MBTA | 1.0% | 1 |
| Example 24 | HF | 1.0% | 10 | 5-MBTA | 1.0% | 1 |
| Example 25 | HF | 1.0% | 10 | ABA | 1.0% | 1 |
| Example 26 | HF | 1.0% | 10 | PAA | 1.0% | 1 |
| Example 27 | HF | 1.0% | 10 | BTA TAZ | 1.0% 0.5% | 1 |
| Example 28 | HF | 1.0% | 10 | DdA | 1.0% | 1 |
| Example 29 | HF | 1.0% | 10 | FS-3PG | 0.05% | 1 |
| Example 30 | HF | 1.0% | 10 | HLP-1 | 0.05% | 1 |
| Example 31 | HF | 1.0% | 10 | $CeCl_3$ | 1.0% | 1 |
| Example 32 | HF | 1.0% | 10 | 5-MBTA | 1.0% | 1 |
| Example 33 | HF | 1.0% | 10 | 5-MBTA | 1.0% | 1 |
| Example 34 | HF | 1.0% | 10 | 5-MBTA | 0.1% | 1 |
| Example 35 | HF | 1.0% | 10 | 5-MBTA | 1.0% | $1.0 \times 10^4$ |
| Example 36 | HF | 1.0% | 10 | 5-MBTA | 1.0% | $1.0 \times 10^5$ |
| Example 37 | HF | 1.0% | 10 | 5-MBTA | 1.0% | 1 |
| Example 38 | HF | 1.0% | 10 | 5-MBTA | 1.0% | 1 |
| Example 40 | HF | 1.0% | 10 | 5-MBTA | 1.0% | 1 |
| Comparative Example 1 | HF | 1.0% | 10 | | | 1 |
| Comparative Example 2 | HF | 1.0% | $1.0 \times 10^7$ | 5-MBTA | 1.0% | $1.0 \times 10^6$ |

TABLE 1-continued

| | | | | | | | |
|---|---|---|---|---|---|---|---|
| Comparative Example 3 | HF | 1.0% | 0.1 | 5-MBTA | 1.0% | | 1 |
| Example 42 | NH$_4$F | 1.0% | 10 | 5-MBTA | 1.0% | | 1 |
| Example 43 | NH$_4$F | 3.0% | 10 | 5-MBTA | 1.0% | | 1 |
| Example 44 | NH$_4$F | 5.0% | 10 | 5-MBTA | 1.0% | | 1 |
| Example 45 | NH$_4$F | 1.0% | 10 | 5-MBTA | 1.0% | | 1 |
| Example 46 | NH$_4$F | 2.0% | 10 | 5-MBTA | 1.0% | | 1 |
| Example 47 | NH$_4$F | 1.0% | 10 | TGC | 1.0% | | 1 |

| Table 1 (Table 1-1) | Inorganic acid (E) | | Organic solvent | | Oxidizing agent (F) | | Water | |
|---|---|---|---|---|---|---|---|---|
| | Type | Content | Type | Content | Type | Content | Content | pH |
| Example 1 | | | EGBE | 20.0% | | | Balance | 2.5 |
| Example 2 | | | EGBE | 20.0% | | | Balance | 2.5 |
| Example 3 | | | EGBE | 20.0% | | | Balance | 2.5 |
| Example 4 | | | EGBE | 20.0% | | | Balance | 2.5 |
| Example 5 | | | EGBE | 20.0% | | | Balance | 2.5 |
| Example 6 | | | EGBE | 20.0% | | | Balance | 2.5 |
| Example 7 | | | EGBE | 20.0% | | | Balance | 2.5 |
| Example 8 | | | EGBE | 20.0% | | | Balance | 2.5 |
| Example 9 | | | EGBE | 20.0% | | | Balance | 2.5 |
| Example 10 | | | EGBE | 20.0% | | | Balance | 2.5 |
| Example 11 | | | EGBE | 20.0% | | | Balance | 2.5 |
| Example 12 | | | EGBE | 20.0% | | | Balance | 2.5 |
| Example 13 | | | EGBE | 20.0% | | | Balance | 2.5 |
| Example 14 | | | EGBE | 58.0% | | | Balance | 2.5 |
| Example 15 | | | EGBE | 78.0% | | | Balance | 2.5 |
| Example 16 | | | EGBE | 10.0% | | | Balance | 2.5 |
| Example 17 | | | EGBE | 1.0% | | | Balance | 2.5 |
| Example 18 | | | EGBE | 20.0% | | | Balance | 4.5 |
| Example 19 | | | EGBE | 20.0% | | | Balance | 6.5 |
| Example 20 | | | EGBE | 20.0% | | | Balance | 1 |
| Example 21 | | | EGBE | 20.0% | | | Balance | 8 |
| Example 22 | | | EGBE | 20.0% | H$_2$O$_2$ | 0.50% | Balance | 2.5 |
| Example 23 | | | EGBE | 20.0% | H$_2$O$_2$ | 1.0% | Balance | 2.5 |
| Example 24 | | | EGBE | 20.0% | H$_2$O$_2$ | 3.0% | Balance | 2.5 |
| Example 25 | | | EGBE | 20.0% | | | Balance | 2.5 |
| Example 26 | | | EGBE | 20.0% | | | Balance | 2.5 |
| Example 27 | | | EGBE | 20.0% | | | Balance | 2.5 |
| Example 28 | | | EGBE | 20.0% | | | Balance | 2.5 |
| Example 29 | | | EGBE | 20.0% | | | Balance | 2.5 |
| Example 30 | | | EGBE | 20.0% | | | Balance | 2.5 |
| Example 31 | | | EGBE | 20.0% | | | Balance | 2.5 |
| Example 32 | HNO$_3$ | 0.1% | EGBE | 20.0% | | | Balance | 2.5 |
| Example 33 | HNO$_3$ | 10.0% | EGBE | 20.0% | | | Balance | 2.5 |
| Example 34 | HNO$_3$ | 10.0% | EGBE | 20.0% | | | Balance | 2.5 |
| Example 35 | HNO$_3$ | 0.01% | EGBE | 20.0% | | | Balance | 2.5 |
| Example 36 | HNO$_3$ | 0.01% | EGBE | 20.0% | | | Balance | 2.5 |
| Example 37 | HNO$_3$ | 1.0% | EGBE | 20.0% | | | Balance | 2.5 |
| Example 38 | HNO$_3$ | 0.1% | EGBE | 20.0% | H$_2$O$_2$ | 1.0% | Balance | 2.5 |
| Example 40 | HNO$_3$ | 0.1% | EGBE | 20.0% | H$_2$O$_2$ | 10.0% | Balance | 2.5 |
| Comparative Example 1 | | | MSA | 77.0% | | | Balance | 2.5 |
| Comparative Example 2 | | | MSA | 77.0% | | | Balance | 2.5 |
| Comparative Example 3 | | | EGBE | 20.0% | | | Balance | 2.5 |
| Example 42 | | | DEGME | 78.0% | | | Balance | 6 |
| Example 43 | | | EGME | 70.0% | | | Balance | 6 |
| Example 44 | | | EGME | 70.0% | | | Balance | 6 |
| Example 45 | | | EGBE | 78.0% | | | Balance | 6 |
| Example 46 | | | DMSO | 70.0% | | | Balance | 6 |
| Example 47 | | | DEGME | 78.0% | | | Balance | 6 |

TABLE 2

| Table 1 (Table 1-2) | B/A | B/C | D/C | D/E | E/F | E/C | $\eta_1/\eta_2$ | Corrosion resistance Co Measured value Å/min |
|---|---|---|---|---|---|---|---|---|
| Example 1 | $1.0 \times 10^{-9}$ | $1.0 \times 10^{-9}$ | $1.0 \times 10^{-10}$ | | | | 1 | 43 |
| Example 2 | $2.0 \times 10^{-9}$ | $1.0 \times 10^{-9}$ | $1.0 \times 10^{-10}$ | | | | 1 | 38 |

TABLE 2-continued

| | | | | | | | |
|---|---|---|---|---|---|---|---|
| Example 3 | $6.7 \times 10^{-10}$ | $1.0 \times 10^{-9}$ | $1.0 \times 10^{-10}$ | | | 1 | 49 |
| Example 4 | $1.0 \times 10^{-9}$ | $1.0 \times 10^{-10}$ | $1.0 \times 10^{-11}$ | | | 1 | 32 |
| Example 5 | $1.0 \times 10^{-9}$ | $1.0 \times 10^{-4}$ | $1.0 \times 10^{-5}$ | | | 1 | 49 |
| Example 6 | $1.0 \times 10^{-7}$ | $1.0 \times 10^{-7}$ | $1.0 \times 10^{-10}$ | | | 1 | 32 |
| Example 7 | $1.0 \times 10^{-8}$ | $1.0 \times 10^{-3}$ | $1.0 \times 10^{-5}$ | | | 1 | 51 |
| Example 8 | $1.0 \times 10^{-9}$ | $1.0 \times 10^{-9}$ | $1.0 \times 10^{-10}$ | | | 1 | 41 |
| Example 9 | $1.0 \times 10^{-9}$ | $1.0 \times 10^{-9}$ | $1.0 \times 10^{-10}$ | | | 1 | 39 |
| Example 10 | $1.0 \times 10^{-9}$ | $1.0 \times 10^{-9}$ | $1.0 \times 10^{-10}$ | | | 1 | 38 |
| Example 11 | $1.0 \times 10^{-9}$ | $1.0 \times 10^{-9}$ | $1.0 \times 10^{-10}$ | | | 1 | 39 |
| Example 12 | $9.0 \times 10^{-6}$ | $9.0 \times 10^{-6}$ | $9.0 \times 10^{-7}$ | | | 1 | 43 |
| Example 13 | $1.0 \times 10^{-5}$ | $1.0 \times 10^{-5}$ | $1.0 \times 10^{-6}$ | | | 1 | 46 |
| Example 14 | $1.0 \times 10^{-9}$ | $1.0 \times 10^{-9}$ | $1.0 \times 10^{-10}$ | | | 1.5 | 31 |
| Example 15 | $1.0 \times 10^{-9}$ | $1.0 \times 10^{-9}$ | $1.0 \times 10^{-10}$ | | | 2.5 | 28 |
| Example 16 | $1.0 \times 10^{-9}$ | $1.0 \times 10^{-9}$ | $1.0 \times 10^{-10}$ | | | 1 | 42 |
| Example 17 | $1.0 \times 10^{-9}$ | $1.0 \times 10^{-9}$ | $1.0 \times 10^{-10}$ | | | 1 | 45 |
| Example 18 | $1.0 \times 10^{-9}$ | $1.0 \times 10^{-9}$ | $1.0 \times 10^{-10}$ | | | 1 | 41 |
| Example 19 | $1.0 \times 10^{-9}$ | $1.0 \times 10^{-9}$ | $1.0 \times 10^{-10}$ | | | 1 | 42 |
| Example 20 | $1.0 \times 10^{-9}$ | $1.0 \times 10^{-9}$ | $1.0 \times 10^{-10}$ | | | 1 | 42 |
| Example 21 | $1.0 \times 10^{-9}$ | $1.0 \times 10^{-9}$ | $1.0 \times 10^{-10}$ | | | 1 | 32 |
| Example 22 | $1.0 \times 10^{-9}$ | $1.0 \times 10^{-9}$ | $1.0 \times 10^{-10}$ | | | 1 | 44 |
| Example 23 | $1.0 \times 10^{-9}$ | $1.0 \times 10^{-9}$ | $1.0 \times 10^{-10}$ | | | 1 | 48 |
| Example 24 | $1.0 \times 10^{-9}$ | $1.0 \times 10^{-9}$ | $1.0 \times 10^{-10}$ | | | 1 | 52 |
| Example 25 | $1.0 \times 10^{-9}$ | $1.0 \times 10^{-9}$ | $1.0 \times 10^{-10}$ | | | 1 | 21 |
| Example 26 | $1.0 \times 10^{-9}$ | $1.0 \times 10^{-9}$ | $1.0 \times 10^{-10}$ | | | 1 | 15 |
| Example 27 | $1.0 \times 10^{-9}$ | $6.7 \times 10^{-10}$ | $6.7 \times 10^{-11}$ | | | 1 | 12 |
| Example 28 | $1.0 \times 10^{-9}$ | $1.0 \times 10^{-9}$ | $1.0 \times 10^{-10}$ | | | 1 | 11 |
| Example 29 | $1.0 \times 10^{-9}$ | $2.0 \times 10^{-8}$ | $2.0 \times 10^{-9}$ | | | 1 | 13 |
| Example 30 | $1.0 \times 10^{-9}$ | $2.0 \times 10^{-8}$ | $2.0 \times 10^{-9}$ | | | 1 | 12 |
| Example 31 | $1.0 \times 10^{-9}$ | $1.0 \times 10^{-9}$ | $1.0 \times 10^{-10}$ | | | 1 | 10 |
| Example 32 | $1.0 \times 10^{-9}$ | $1.0 \times 10^{-9}$ | $1.0 \times 10^{-10}$ | $1.0 \times 10^{-9}$ | 0.1 | 1 | 13 |
| Example 33 | $1.0 \times 10^{-9}$ | $1.0 \times 10^{-9}$ | $1.0 \times 10^{-10}$ | $1.0 \times 10^{-11}$ | 10 | 1 | 21 |
| Example 34 | $1.0 \times 10^{-9}$ | $1.0 \times 10^{-8}$ | $1.0 \times 10^{-9}$ | $1.0 \times 10^{-11}$ | 100 | 1 | 48 |
| Example 35 | $1.0 \times 10^{-9}$ | $1.0 \times 10^{-9}$ | $1.0 \times 10^{-10}$ | $1.0 \times 10^{-6}$ | 0.01 | 1 | 11 |
| Example 36 | $1.0 \times 10^{-9}$ | $1.0 \times 10^{-9}$ | $1.0 \times 10^{-5}$ | $1.0 \times 10^{-3}$ | 0.01 | 1 | 11 |
| Example 37 | $1.0 \times 10^{-9}$ | $1.0 \times 10^{-9}$ | $1.0 \times 10^{-10}$ | $1.0 \times 10^{-10}$ | 1 | 1 | 45 |
| Example 38 | $1.0 \times 10^{-9}$ | $1.0 \times 10^{-9}$ | $1.0 \times 10^{-10}$ | $1.0 \times 10^{-9}$ 0.1 | 0.1 | 1 | 48 |
| Example 40 | $1.0 \times 10^{-9}$ | $1.0 \times 10^{-9}$ | $1.0 \times 10^{-10}$ | $1.0 \times 10^{-9}$ 0.01 | 0.1 | 1 | 48 |
| Comparative Example 1 | $1.0 \times 10^{-9}$ | | | | | 1 | 62 |
| Comparative Example 2 | $1.0 \times 10^{-3}$ | $1.0 \times 10^{-3}$ | $1.0 \times 10^{-4}$ | | | 1 | 45 |
| Comparative Example 3 | $1.0 \times 10^{-11}$ | $1.0 \times 10^{-11}$ | $1.0 \times 10^{-10}$ | | | 1 | 43 |
| Example 42 | $1.0 \times 10^{-9}$ | $1.0 \times 10^{-9}$ | $1.0 \times 10^{-10}$ | | | 2.5 | 5 |
| Example 43 | $3.3 \times 10^{-10}$ | $1.0 \times 10^{-9}$ | $1.0 \times 10^{-10}$ | | | 1.5 | 8 |
| Example 44 | $2.0 \times 10^{-10}$ | $1.0 \times 10^{-9}$ | $1.0 \times 10^{-10}$ | | | 1.5 | 10 |
| Example 45 | $1.0 \times 10^{-9}$ | $1.0 \times 10^{-9}$ | $1.0 \times 10^{-10}$ | | | 2.5 | 4 |
| Example 46 | $5.0 \times 10^{-10}$ | $1.0 \times 10^{-9}$ | $1.0 \times 10^{-10}$ | | | 1 | 4 |
| Example 47 | $1.0 \times 10^{-9}$ | $1.0 \times 10^{-9}$ | $1.0 \times 10^{-10}$ | | | 1 | 5 |

| | | Corrosion resistance | | | | | |
|---|---|---|---|---|---|---|---|
| | | W | | SiO2 | | | |
| Table 1 (Table 1-2) | Co Evaluation | Measured value Å/min | Evaluation | Measured value Å/min | Evaluation | Residue removing capability | Defect performance |
| Example 1 | D | 5 | A | 15 | B | B | A |
| Example 2 | C | 3 | A | 9 | A | B | A |
| Example 3 | D | 8 | A | 21 | C | B | A |
| Example 4 | C | 6 | A | 16 | B | C | C |
| Example 5 | D | 7 | A | 17 | B | C | C |
| Example 6 | C | 6 | A | 16 | B | C | C |
| Example 7 | E | 7 | A | 17 | B | C | C |
| Example 8 | D | 4 | A | 15 | B | B | A |
| Example 9 | C | 5 | A | 9 | A | B | A |
| Example 10 | C | 4 | A | 14 | B | B | A |
| Example 11 | C | 4 | A | 13 | B | B | A |
| Example 12 | D | 6 | A | 12 | B | B | C |
| Example 13 | D | 4 | A | 15 | B | C | C |
| Example 14 | C | 5 | A | 10 | B | B | A |
| Example 15 | B | 4 | A | 8 | A | B | A |
| Example 16 | D | 5 | A | 15 | B | C | A |
| Example 17 | D | 3 | A | 15 | B | C | A |
| Example 18 | D | 5 | A | 14 | B | C | A |
| Example 19 | D | 8 | A | 6 | A | C | A |
| Example 20 | D | 18 | B | 6 | A | C | B |
| Example 21 | C | 26 | C | 6 | A | C | B |
| Example 22 | D | 11 | B | 3 | A | A | A |

TABLE 2-continued

| | | | | | | | |
|---|---|---|---|---|---|---|---|
| Example 23 | D | 18 | B | 4 | A | A | A |
| Example 24 | E | 20 | C | 4 | A | A | A |
| Example 25 | B | 4 | A | 14 | B | B | A |
| Example 26 | A | 5 | A | 12 | B | B | A |
| Example 27 | A | 6 | A | 15 | B | B | A |
| Example 28 | A | 2 | A | 13 | B | B | A |
| Example 29 | A | 3 | A | 14 | B | B | A |
| Example 30 | A | 4 | A | 14 | B | B | A |
| Example 31 | A | 1 | A | 3 | A | B | A |
| Example 32 | A | 13 | B | 15 | B | B | A |
| Example 33 | B | 8 | A | 15 | B | B | B |
| Example 34 | D | 8 | A | 15 | B | B | B |
| Example 35 | A | 13 | B | 15 | B | B | C |
| Example 36 | A | 13 | B | 15 | B | C | C |
| Example 37 | D | 11 | B | 12 | B | B | A |
| Example 38 | D | 12 | B | 13 | B | A | A |
| Example 40 | D | 25 | C | 13 | B | A | C |
| Comparative Example 1 | F | 6 | A | 15 | B | A | A |
| Comparative Example 2 | D | 5 | A | 14 | B | D | D |
| Comparative Example 3 | D | 5 | A | 15 | B | C | D |
| Example 42 | A | 4 | A | 8 | A | A | A |
| Example 43 | A | 5 | A | 9 | A | A | A |
| Example 44 | B | 7 | A | 15 | B | A | A |
| Example 45 | A | 4 | A | 3 | A | A | A |
| Example 46 | A | 6 | A | 13 | B | B | A |
| Example 47 | A | 4 | A | 3 | A | A | A |

TABLE 3

| Table 1 (Table 2-1) | Fluorine-containing compound (A) Type | Content | Ca content (B) ppt by mass | Corrosion inhibitor (C) Type | Content | Pb content (D) ppt by mass | Inorganic acid (E) Type | Content | Organic solvent Type | Content | Oxidizing agent (F) Type | Content | Water Content | pH |
|---|---|---|---|---|---|---|---|---|---|---|---|---|---|---|
| Example 48 | $NH_4F$ | 1.0% | 10 | TMA | 1.0% | 1 | | | DEGME | 78.0% | | | Balance | 6 |
| Example 49 | $NH_4F$ | 1.0% | 10 | Cys | 1.0% | 1 | | | DEGME | 78.0% | | | Balance | 6 |
| Example 50 | $NH_4F$ | 1.0% | 10 | DTPA | 1.0% | 1 | | | DEGME | 78.0% | | | Balance | 6 |
| Example 51 | $NH_4F$ | 1.0% | 10 | EDTA | 1.0% | 1 | | | DEGME | 78.0% | | | Balance | 6 |
| Example 52 | $NH_4F$ | 1.0% | 10 | DBU | 1.0% | 1 | | | DEGME | 78.0% | | | Balance | 6 |
| Example 53 | $NH_4F$ | 1.0% | 10 | DABCO | 1.0% | 1 | | | DEGME | 78.0% | | | Balance | 6 |
| Example 54 | $NH_4F$ | 1.0% | 10 | SBTL | 1.0% | 1 | | | DEGME | 78.0% | | | Balance | 6 |
| Example 55 | $NH_4F$ | 1.0% | 10 | MPA | 1.0% | 1 | | | DEGME | 78.0% | | | Balance | 6 |
| Example 56 | $NH_4F$ | 1.0% | 10 | 5-MBTA | 1.0% | 1 | | | DEGME | 68.0% | | | Balance | 6 |
| Example 57 | $NH_4F$ | 1.0% | 10 | 5-MBTA | 1.0% | 1 | | | DEGME | 58.0% | | | Balance | 6 |
| Comparative Example 4 | $NH_4F$ | 1.0% | 0 | 5-MBTA | 1.0% | 0 | | | EGME | 78.0% | | | Balance | 6 |

TABLE 4

| Table 1 (Table 2-2) | B/A | B/C | D/C | D/E | E/F | E/C | $\eta_1/\eta_2$ | Corrosion resistance Co Measured value Å/min | Evaluation | W Measured value Å/min | Evaluation | $SiO_2$ Measured value Å/min | Evaluation | Residue removing capability | Defect performance |
|---|---|---|---|---|---|---|---|---|---|---|---|---|---|---|---|
| Example 48 | $1.0 \times 10^{-9}$ | $1.0 \times 10^{-9}$ | $1.0 \times 10^{-10}$ | | | | 1 | 8 | A | 5 | A | 12 | B | B | A |
| Example 49 | $1.0 \times 10^{-9}$ | $1.0 \times 10^{-9}$ | $1.0 \times 10^{-10}$ | | | | 1 | 6 | A | 3 | A | 8 | A | B | A |
| Example 50 | $1.0 \times 10^{-9}$ | $1.0 \times 10^{-9}$ | $1.0 \times 10^{-10}$ | | | | 1 | 8 | A | 5 | A | 9 | A | B | A |
| Example 51 | $1.0 \times 10^{-9}$ | $1.0 \times 10^{-9}$ | $1.0 \times 10^{-10}$ | | | | 1 | 7 | A | 6 | A | 8 | A | B | A |
| Example 52 | $1.0 \times 10^{-9}$ | $1.0 \times 10^{-9}$ | $1.0 \times 10^{-10}$ | | | | 1 | 6 | A | 5 | A | 7 | A | B | A |
| Example 53 | $1.0 \times 10^{-9}$ | $1.0 \times 10^{-9}$ | $1.0 \times 10^{-10}$ | | | | 1 | 3 | A | 4 | A | 8 | A | B | A |
| Example 54 | $1.0 \times 10^{-9}$ | $1.0 \times 10^{-9}$ | $1.0 \times 10^{-10}$ | | | | 1 | 7 | A | 3 | A | 6 | A | A | A |

TABLE 4-continued

| Table 1 (Table 2-2) | B/A | B/C | D/C | D/E | E/F | E/C | $\eta_1/\eta_2$ | Co Measured value Å/min | Co Evaluation | W Measured value Å/min | W Evaluation | $SiO_2$ Measured value Å/min | $SiO_2$ Evaluation | Residue removing capability | Defect performance |
|---|---|---|---|---|---|---|---|---|---|---|---|---|---|---|---|
| Example 55 | $1.0 \times 10^{-9}$ | $1.0 \times 10^{-9}$ | $1.0 \times 10^{-10}$ | | | | 1 | 5 | A | 4 | A | 8 | A | B | A |
| Example 56 | $1.0 \times 10^{-9}$ | $1.0 \times 10^{-9}$ | $1.0 \times 10^{-10}$ | | | | 2.5 | 8 | A | 7 | A | 12 | B | B | A |
| Example 57 | $1.0 \times 10^{-9}$ | $1.0 \times 10^{-9}$ | $1.0 \times 10^{-10}$ | | | | 1.8 | 9 | A | 12 | B | 14 | B | A | A |
| Comparative Example 4 | 0 | 0 | 0 | | | | 2.5 | 72 | F | 13 | B | 69 | F | A | C |

[Evaluation of Charge Elimination]

For the treatment liquid of Example 1, various evaluations were performed in both of a case where the charge eliminating step had been performed and a case where the charge eliminating step had not been performed in the same manner except that the immersion time was set to 20 minutes and charge elimination was performed with a material SUS316 grounded.

As a result of the evaluations, in the case where the charge eliminating step had been performed, a reduction in the degree of charging was confirmed, as compared with the case where the charge eliminating step had not been performed, and thus, the residue removing performance and the defect performance were improved.

For each of the treatment liquids of Comparative Examples 1 to 3, an evaluation on charge elimination was performed in the same manner as above. As a result of the evaluation, a change in the residue removing performance and the defect performance was not confirmed.

[Recycling Test]

For the treatment liquid of Example 1, evaluation tests 1 to 3 were consecutively performed five times. Thereafter, the recovered liquid was returned to the tank, and the liquid was subjected to the test again.

That is, each of 5 objects to be treated was consecutively treated while not changing the treatment liquid, and the 6$^{th}$ object to be treated was subjected to the above-mentioned evaluations to evaluate various performances (which is referred to as a "recycling test").

As a result of the evaluations, it was confirmed that in a case where the recycling test was performed, there was no difference in the performance, and thus, there was no problem, as compared with the case where the recycling test was not been performed.

For each of the treatment liquids in Comparative Examples 1 to 3, the same recycling test as above was performed.

As a result of the evaluations, it was confirmed that in the case where the recycling test was performed, the residue removing performance and the defect performance were deteriorated, as compared with the case where the recycling test was not performed.

As seen from the results shown in Table 1, the treatment liquids of Examples 1 to 40, which are treatment liquids for a semiconductor device, containing a fluorine-containing compound, a corrosion inhibitor, and calcium, and having a mass content ratio of the calcium to the fluorine-containing compound in the treatment liquid of $1.0 \times 10^{-10}$ to $1.0 \times 10^{-4}$, had the effects of the present invention.

On the other hand, the treatment liquids of Comparative Examples 1 to 3 did not have desired effects.

Furthermore, the treatment liquids of Examples 1, 34, 29, 6, 12, 13, and 5, in which B/C was $1.0 \times 10^{-4}$ or less, had more excellent corrosion resistance for Co, as compared with the treatment liquid of Example 7.

Moreover, the treatment liquid of Example 33, in which E/C was 10 or less, had more excellent corrosion resistance for Co, as compared with the treatment liquid of Example 34.

Incidentally, the treatment liquid of Example 37, in which D/E was $1.0 \times 10^{-10}$ or more, had more excellent defect performance, as compared with the treatment liquid of Example 33. Further, the treatment liquid of Example 35, in which D/E was $1.0 \times 10^{-4}$ or less, had more excellent residue removing capability, as compared with the treatment liquid of Example 36.

Furthermore, the treatment liquid of Example 28, in which D/C was $6.0 \times 10^{-11}$ or more, had more excellent residue removing capability and further suppressed generation of defects, as compared with the treatment liquid of Example 4.

Moreover, the treatment liquid of Example 35, in which the content of the lead was 10 ppb by mass or less, had more excellent residue removing capability, as compared with the treatment liquid of Example 36.

In addition, the treatment liquid of Example 1, in which pH was more than 1.5, had more excellent defect performance and residue removing capability, as compared with the treatment liquid of Example 20. The treatment liquid of Example 19, in which pH was less than 7.0, had more excellent defect performance, as compared with the treatment liquid of Example 21.

Furthermore, the treatment liquid of Example 45, in which the fluorine-containing compound was $NH_4F$, had more excellent corrosion resistance for Co, as compared with the treatment liquid of Example 15.

Moreover, the treatment liquids of Examples 42, 45, and 47 to 56, in which the type of the corrosion inhibitor was at least one compound selected from the group consisting of the compound represented by Formula (A), the compound represented by Formula (C), a sugar alcohol, a polyaminocarboxylic acid or a salt thereof, the compound represented by Formula (D), and the compound represented by Formula (E), had more excellent corrosion resistance for Co, as compared with the treatment liquid of Example 25.

In addition, the treatment liquid of Example 15, in which the content of the water was 1% to 40% by mass and the content of the organic solvent was 40% to 98% by mass, with respect to the total mass of the treatment liquid, had more excellent corrosion resistance for Co, as compared with the treatment liquid of Example 1.

EXPLANATION OF REFERENCES 1 substrate
2 metal layer
3 etching stop layer
4 interlayer insulating film
5 metal hard mask
6 hole
10 laminate
11 inner wall
11a cross-sectional wall
11b bottom wall
12 dry etching residue

What is claimed is:

1. A treatment liquid for a semiconductor device, comprising:
    a fluorine-containing compound;
    a corrosion inhibitor; and
    calcium,
    wherein the mass content ratio of the calcium to the fluorine-containing compound in the treatment liquid is $1.0 \times 10^{-8}$ or less, and
    the mass content ratio of the calcium to the corrosion inhibitor is $1.0 \times 10^{-10}$ to $1.0 \times 10^{-7}$.

2. The treatment liquid according to claim 1,
    wherein the content of the calcium is 0.1 ppt by mass to 1,000 ppb by mass with respect to the total mass of the treatment liquid.

3. The treatment liquid according to claim 1, further comprising an organic solvent.

4. The treatment liquid according to claim 3, further comprising water,
    wherein the content of the water is 20% to 98% by mass with respect to the total mass of the treatment liquid, and
    the content of the organic solvent is 1% to 40% by mass with respect to the total mass of the treatment liquid.

5. The treatment liquid according to claim 3, further comprising water,
    wherein the content of the water is 1% to 40% by mass with respect to the total mass of the treatment liquid, and
    the content of the organic solvent is 20% to 98% by mass with respect to the total mass of the treatment liquid.

6. The treatment liquid according to claim 1, further comprising an inorganic acid.

7. The treatment liquid according to claim 6,
    wherein the mass content ratio of the inorganic acid to the corrosion inhibitor is 0.01 to 10.

8. The treatment liquid according to claim 7, further comprising lead,
    wherein the mass content ratio of the lead to the inorganic acid is $1.0 \times 10^{-1}$ to $1.0 \times 10^{-4}$.

9. The treatment liquid according to claim 6, further comprising an oxidizing agent,
    wherein the mass content ratio of the inorganic acid to the oxidizing agent is 0.01 to 10.

10. The treatment liquid according to claim 1, further comprising lead.

11. The treatment liquid according to claim 10,
    wherein the mass content ratio of the lead to the corrosion inhibitor is $6.0 \times 10^{-11}$ to $1.0 \times 10^{-4}$.

12. The treatment liquid according to claim 10,
    wherein the content of the lead is 0.1 ppt by mass to 10 ppb by mass with respect to the total mass of the treatment liquid.

13. The treatment liquid according to claim 1, further comprising an oxidizing agent.

14. The treatment liquid according to claim 13,
    wherein the oxidizing agent is hydrogen peroxide.

15. The treatment liquid according to claim 1,
    wherein pH is more than 1.5 and less than 7.0.

16. The treatment liquid according to claim 1,
    wherein the fluorine-containing compound is at least one selected from the group consisting of hydrofluoric acid, ammonium fluoride, tetramethylammonium fluoride, tetrafluoroboric acid, hexafluorophosphoric acid, hexafluorosilicic acid, ammonium tetrafluoroborate, ammonium hexafluorophosphate, and ammonium hexafluorosilicate.

17. The treatment liquid according to claim 1,
    wherein in a case where the viscosity of the treatment liquid at 23° C. is measured using a rotational viscometer, the ratio of the viscosity of the treatment liquid at a rotation speed of 100 rpm to the viscosity of the treatment liquid at a rotation speed of 1,000 rpm is 1.0 to 20.

18. The treatment liquid according to claim 1,
    wherein the semiconductor device contains a substrate comprising a metal layer containing Co, and
    the treatment liquid is used for a treatment to the metal layer.

19. The treatment liquid according to claim 1,
    wherein the semiconductor device contains a substrate comprising a metal layer containing W, and
    the treatment liquid is used for a treatment to the metal layer.

20. The treatment liquid according to claim 1,
    wherein the semiconductor device contains a substrate comprising a layer containing at least one selected from the group consisting of $SiO_x$, SiN, and SiOC, where x represents a number of 1 to 3, and
    the treatment liquid is used for a treatment to the layer.

21. The treatment liquid according to claim 1,
    wherein a resist film is formed during the production of the semiconductor device, and
    the treatment liquid is used for the removal of a resist which is at least one selected from the group consisting of the resist film and a residue of the resist film.

22. A method for washing a substrate, comprising a washing step B in which a substrate comprising a metal layer containing Co is washed using the treatment liquid according to claim 1.

23. The method for washing a substrate according to claim 22, further comprising:
    a drainage recovering step C in which drainage of the treatment liquid used in the washing step B is recovered;
    a washing step D in which a newly prepared substrate comprising at least one selected from the group consisting of a metal layer containing Co, a metal layer containing W, and a layer containing at least one selected from the group consisting of $SiO_x$, SiN, and SiOC, where x represents a number of more than 0 and less than 3, is washed using the recovered drainage of the treatment liquid;
    a drainage recovering step E in which drainage of the treatment liquid used in the washing step D is recovered; and repeating the washing step D and the drainage recovering step E.

24. The method for washing a substrate according to claim 22, further comprising:
a treatment liquid preparing step A in which a treatment liquid is prepared before the washing step B; and
an ion removing step F in which calcium ions are removed from at least one selected from the group consisting of the fluorine-containing compound and the corrosion inhibitor before the treatment liquid preparing step A, and/or
an ion removing step G in which calcium ions in the treatment liquid are removed before the washing step B and after the treatment liquid preparing step A.

25. The method for washing a substrate according to claim 24,
wherein water is used during the preparation of the treatment liquid in the treatment liquid preparing step A, and
the ion removing step F is a step in which calcium ions are removed from at least one selected from the group consisting of the fluorine-containing compound, the corrosion inhibitor, and water.

26. The method for washing a substrate according to claim 22,
wherein the method includes a treatment liquid preparing step A in which a treatment liquid is prepared before the washing step B,
water is used during the preparation of the treatment liquid in the treatment liquid preparing step A, and
the method further comprises a charge eliminating step I in which water is subjected to charge elimination before the treatment liquid preparing step A and/or a charge eliminating step J in which the treatment liquid is subjected to charge elimination before the washing step B and after the treatment liquid preparing step A.

27. A method for washing a substrate, comprising a washing step B in which a substrate comprising a metal layer containing W is washed using the treatment liquid according to claim 1.

28. A method for washing a substrate, comprising a washing step B in which a substrate comprising a layer containing at least one selected from the group consisting of $SiO_x$, SiN, and SiOC, where x represents a number of 1 to 3, is washed using the treatment liquid according to claim 1.

29. A method for removing a resist, comprising removing a resist which is at least one selected from the group consisting of a resist film and a residue of the resist film, using the treatment liquid according to claim 1.

30. The treatment liquid according to claim 1,
wherein the calcium includes a calcium ion and calcium in a non-ionic state.

31. The treatment liquid according to claim 1,
wherein the calcium is a calcium ion.

32. A treatment liquid for a semiconductor device, comprising:
a fluorine-containing compound;
a corrosion inhibitor; and
calcium,
wherein the mass content ratio of the calcium to the fluorine-containing compound in the treatment liquid is $1.0 \times 10^{-8}$ or less, and
the fluorine-containing compound is at least one selected from the group consisting of hydrofluoric acid, ammonium fluoride, tetrafluoroboric acid, hexafluorophosphoric acid, hexafluorosilicic acid, ammonium tetrafluoroborate, ammonium hexafluorophosphate, and ammonium hexafluorosilicate.

33. The treatment liquid according to claim 32, further comprising an inorganic acid.

34. The treatment liquid according to claim 33,
wherein the mass content ratio of the inorganic acid to the corrosion inhibitor is 0.01 to 10.

35. The treatment liquid according to claim 33, further comprising lead,
wherein the mass content ratio of the lead to the inorganic acid is $1.0 \times 10^{-10}$ to $1.0 \times 10^{-4}$.

36. The treatment liquid according to claim 32, further comprising lead.

37. The treatment liquid according to claim 36,
wherein the mass content ratio of the lead to the corrosion inhibitor is $6.0 \times 10^{-11}$ to $1.0 \times 10^{-4}$.

38. The treatment liquid according to claim 32,
wherein the calcium includes a calcium ion and calcium in a non-ionic state.

39. The treatment liquid according to claim 32,
wherein the calcium is a calcium ion.

40. A treatment liquid for a semiconductor device, comprising:
a fluorine-containing compound;
a corrosion inhibitor;
calcium;
lead; and
an inorganic acid,
wherein the mass content ratio of the calcium to the fluorine-containing compound in the treatment liquid is $1.0 \times 10^{-8}$ or less$^{-7}$,
the content of the lead is 0.1 ppt by mass to 10 ppb by mass with respect to the total mass of the treatment liquid, and
the mass content ratio of the lead to the inorganic acid is $1.0 \times 10^{-10}$ to $1.0 \times 10^{-7}$.

41. The treatment liquid according to claim 40,
wherein the mass content ratio of the inorganic acid to the corrosion inhibitor is 0.01 to 10.

42. The treatment liquid according to claim 40,
wherein the mass content ratio of the lead to the corrosion inhibitor is $6.0 \times 10^{-11}$ to $1.0 \times 10^{-4}$.

43. The treatment liquid according to claim 40,
wherein the mass content ratio of the calcium to the corrosion inhibitor is $1.0 \times 10^{-10}$ to $1.0 \times 10^{-7}$.

44. The treatment liquid according to claim 40,
wherein the calcium includes a calcium ion and calcium in a non-ionic state.

45. The treatment liquid according to claim 40,
wherein the calcium is a calcium ion.

* * * * *